US011502623B2

(12) United States Patent
Takahashi

(10) Patent No.: US 11,502,623 B2
(45) Date of Patent: Nov. 15, 2022

(54) PIEZOELECTRIC ACTUATOR, PIEZOELECTRIC MOTOR, AND ROBOT

(71) Applicant: SEIKO EPSON CORPORATION, Tokyo (JP)

(72) Inventor: Tomoaki Takahashi, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 260 days.

(21) Appl. No.: 17/029,084

(22) Filed: Sep. 23, 2020

(65) Prior Publication Data

US 2021/0091684 A1 Mar. 25, 2021

(30) Foreign Application Priority Data

Sep. 24, 2019 (JP) .............................. JP2019-173359

(51) Int. Cl.
*H02N 2/00* (2006.01)
*B25J 9/12* (2006.01)
*H02N 2/10* (2006.01)

(52) U.S. Cl.
CPC .............. *H02N 2/0065* (2013.01); *B25J 9/12* (2013.01); *H02N 2/103* (2013.01)

(58) Field of Classification Search
CPC ...... H02N 2/103; H02N 2/0065; H02N 2/163; G03B 3/10; G03B 17/561; B25J 9/12
See application file for complete search history.

(56) References Cited

U.S. PATENT DOCUMENTS

2018/0034387 A1* 2/2018 Arakawa .............. B65G 47/901

FOREIGN PATENT DOCUMENTS

JP 2011155761 A 8/2011

* cited by examiner

*Primary Examiner* — Emily P Pham
(74) *Attorney, Agent, or Firm* — Yu Gang

(57) ABSTRACT

A piezoelectric actuator includes a vibrating section including a piezoelectric element, a distal end face, and a recess opened on the distal end face and a protrusion section including a base that overlaps the recess in plan view of the distal end face and is fixed to the distal end face and a projection that is provided in the base and projects in an opposite direction of the distal end face, the protrusion section transmitting a driving force of the vibrating section to a driven section. In plan view of the distal end face, the projection is disposed within a range of the recess.

12 Claims, 19 Drawing Sheets

PIEZOELECTRIC ACTUATOR, PIEZOELECTRIC MOTOR, AND ROBOT

The present application is based on, and claims priority from JP Application Serial Number 2019-173359, filed Sep. 24, 2019, the disclosure of which is hereby incorporated by reference herein in its entirety.

BACKGROUND

1. Technical Field

The present disclosure relates to a piezoelectric actuator, a piezoelectric motor, and a robot.

2. Related Art

There has been known an ultrasonic motor that drives a driven section using vibration of a piezoelectric element.

JP-A-2011-155761 (Patent Literature 1) discloses an ultrasonic motor including a vibrator, which is configured by a piezoelectric vibration element including a distal end portion provided at a distal end, and a slider (a driven section) with which the distal end portion comes into fictional contact. In the ultrasonic motor, the piezoelectric vibration element simultaneously generates an expanding and contracting action and a bending action, whereby the distal end portion performs an elliptical motion and intermittently sends out the slider in one direction. Consequently, a driving force for the ultrasonic motor is generated.

The vibrator described in Patent Literature 1 is formed in a rectangular parallelepiped shape. The distal end portion including a pin shaped member and a pin stand is bonded to the distal end face of the vibrator. The pin shaped member is formed in a cylindrical shape or a prismatic shape. The pin stand is a columnar body, a plan view shape of which is formed in a circular shape or a rectangular shape. The pin stand is bonded to the distal end face of the vibrator.

However, the distal end portion described in Patent Literature 1 receives reaction according to the frictional contact with the slider but cannot allow the received reaction to escape because of the structure of the distal end portion. Accordingly, the distal end portion is worn or damaged by the received reaction.

SUMMARY

A piezoelectric actuator according to an application example of the present disclosure includes: a vibrating section including a piezoelectric element, a distal end face, and a recess opened on the distal end face; and a protrusion section including a base that overlaps the recess in plan view of the distal end face and is fixed to the distal end face and a projection that is provided in the base and projects in an opposite direction of the distal end face, the protrusion section transmitting a driving force of the vibrating section to a driven section. In plan view of the distal end face, the projection is disposed within a range of the recess.

DESCRIPTION OF EXEMPLARY EMBODIMENTS

Hereinafter, a piezoelectric actuator a piezoelectric motor, and a robot according to the present disclosure will be described in detail based on the preferred embodiments shown in the attached drawings.

1. First Embodiment 1.1 Piezoelectric Motor

First, a piezoelectric motor according to a first embodiment is explained.

Figure 1:
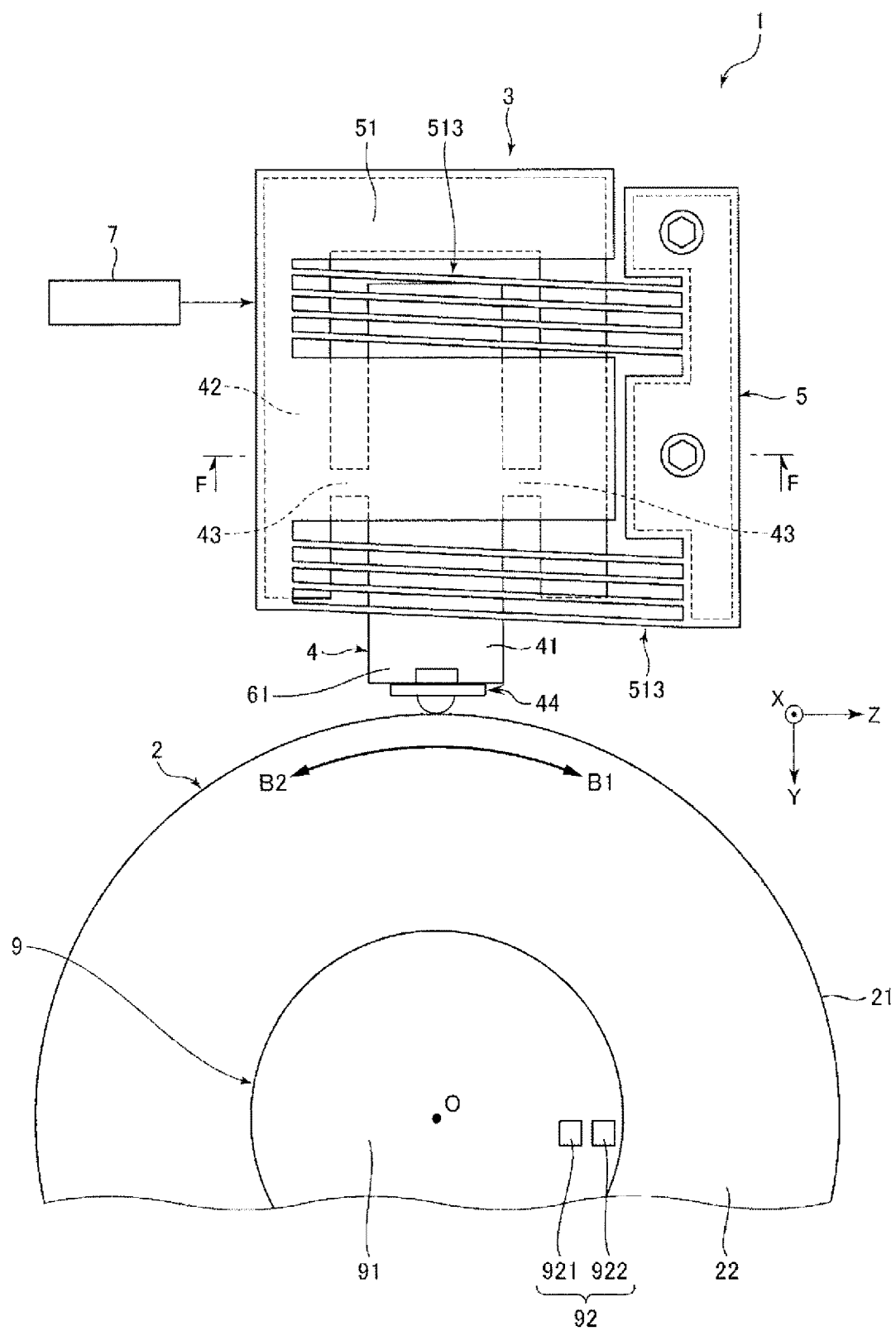
FIG. 1 is a plan view showing a piezoelectric motor according to a first embodiment.
Figure 2:
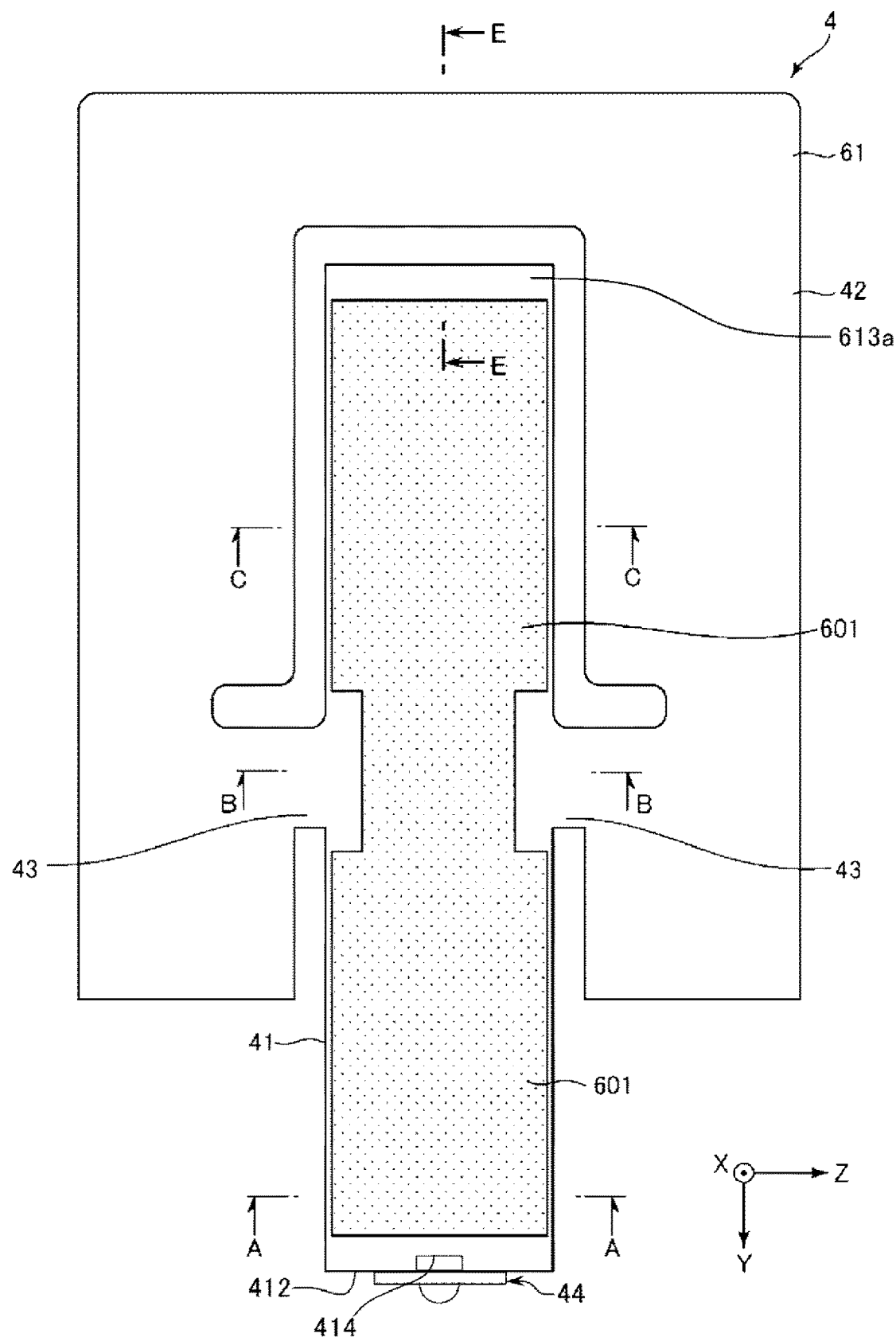
FIG. 2 is a plan view showing disposition of an electrode of a vibrating body shown in FIG. 1.
Figure 3:
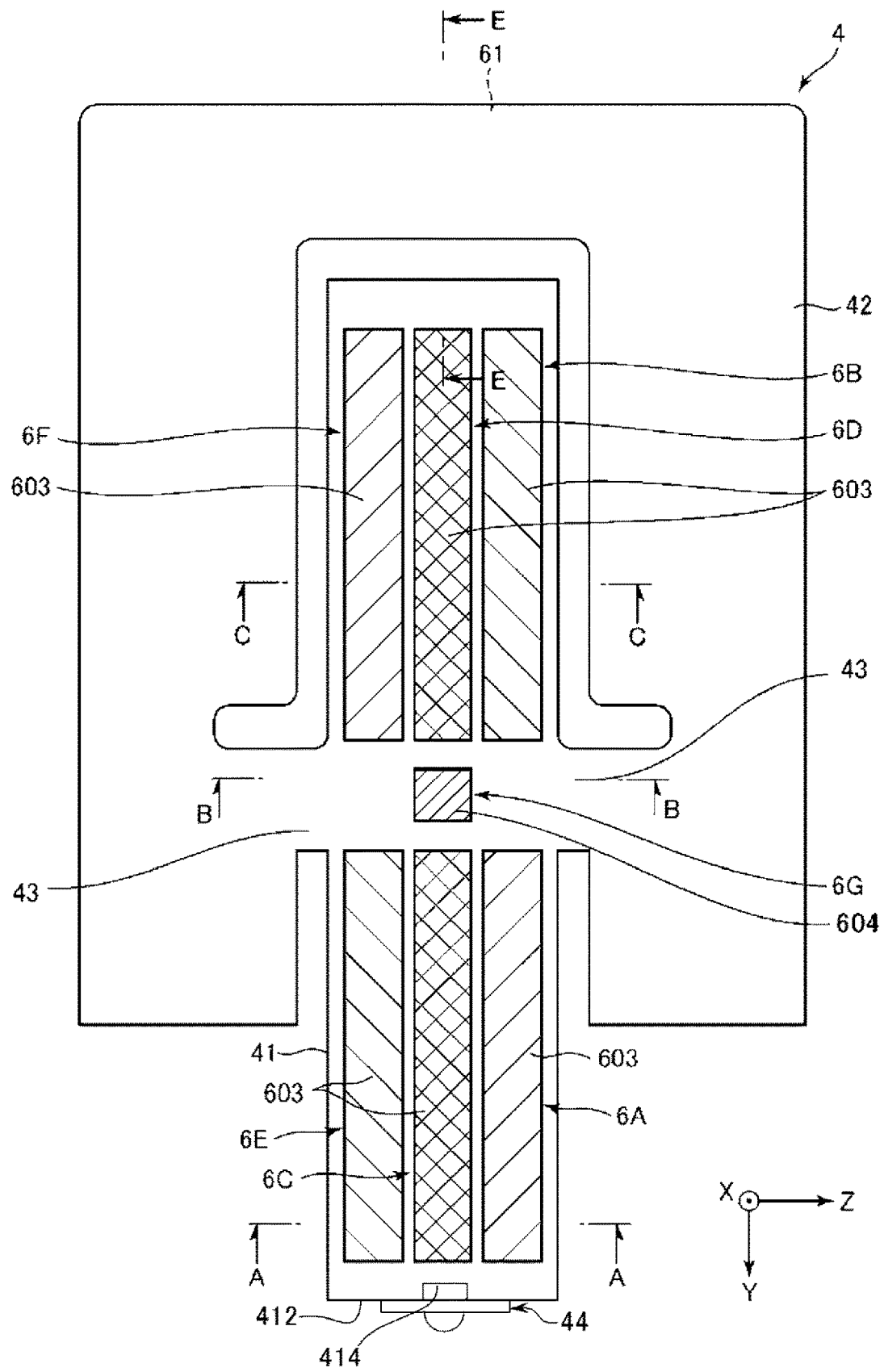
FIG. 3 is a plan view showing the disposition of the electrode of the vibrating body shown in FIG. 1.
Figure 4:
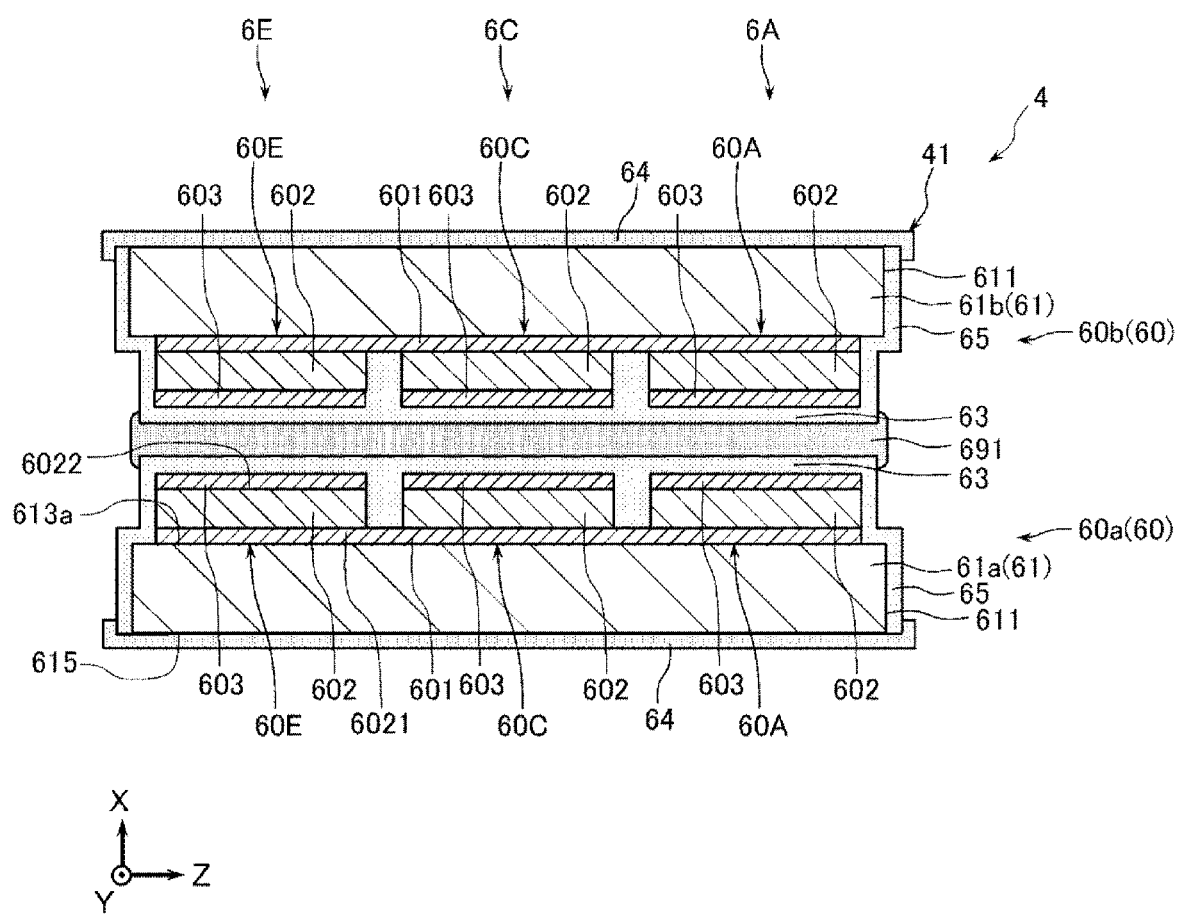
FIG. 4 is an A-A line sectional view of FIGS. 2 and 3.
Figure 5:
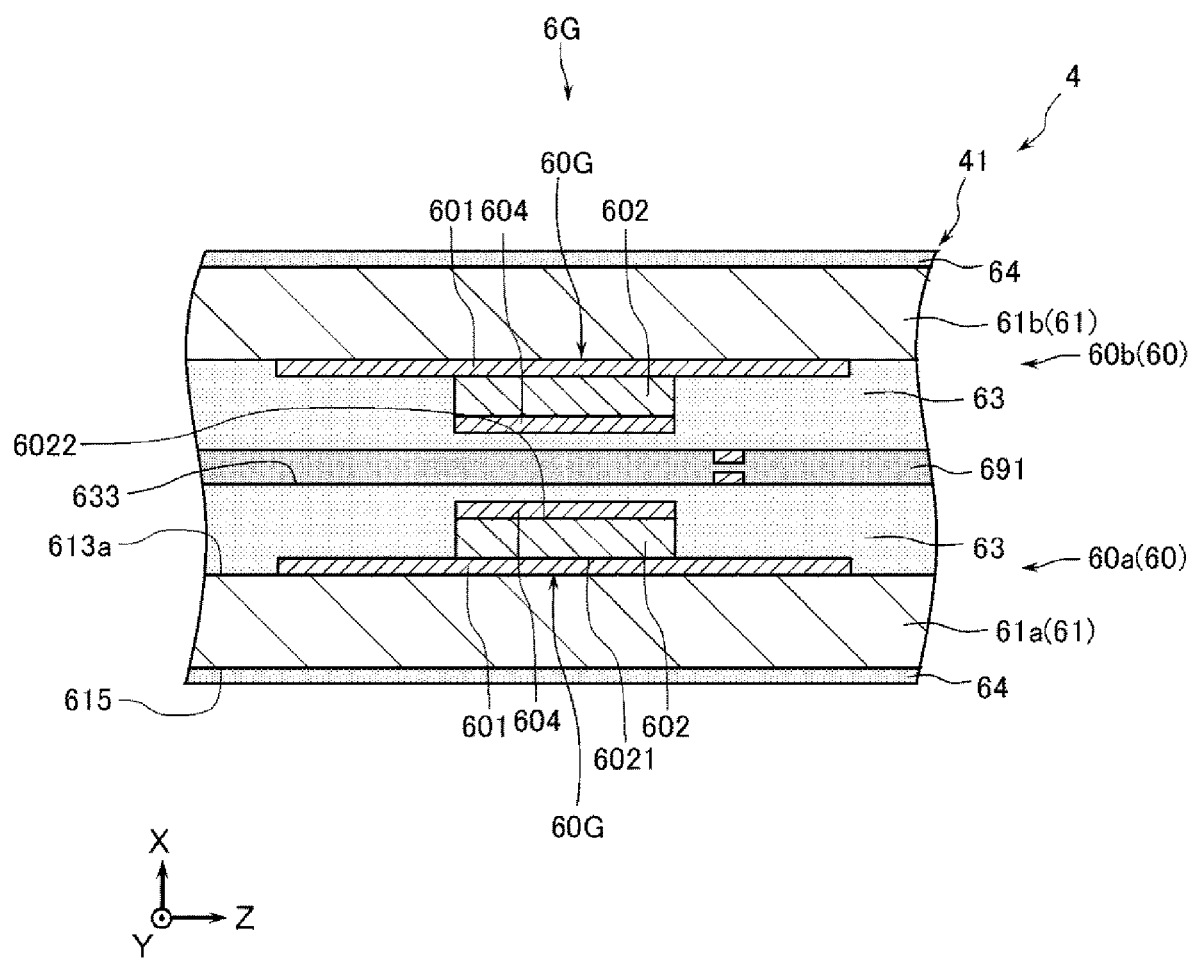
FIG. 5 is a B-B line sectional view of FIGS. 2 and 3.
Figure 6:
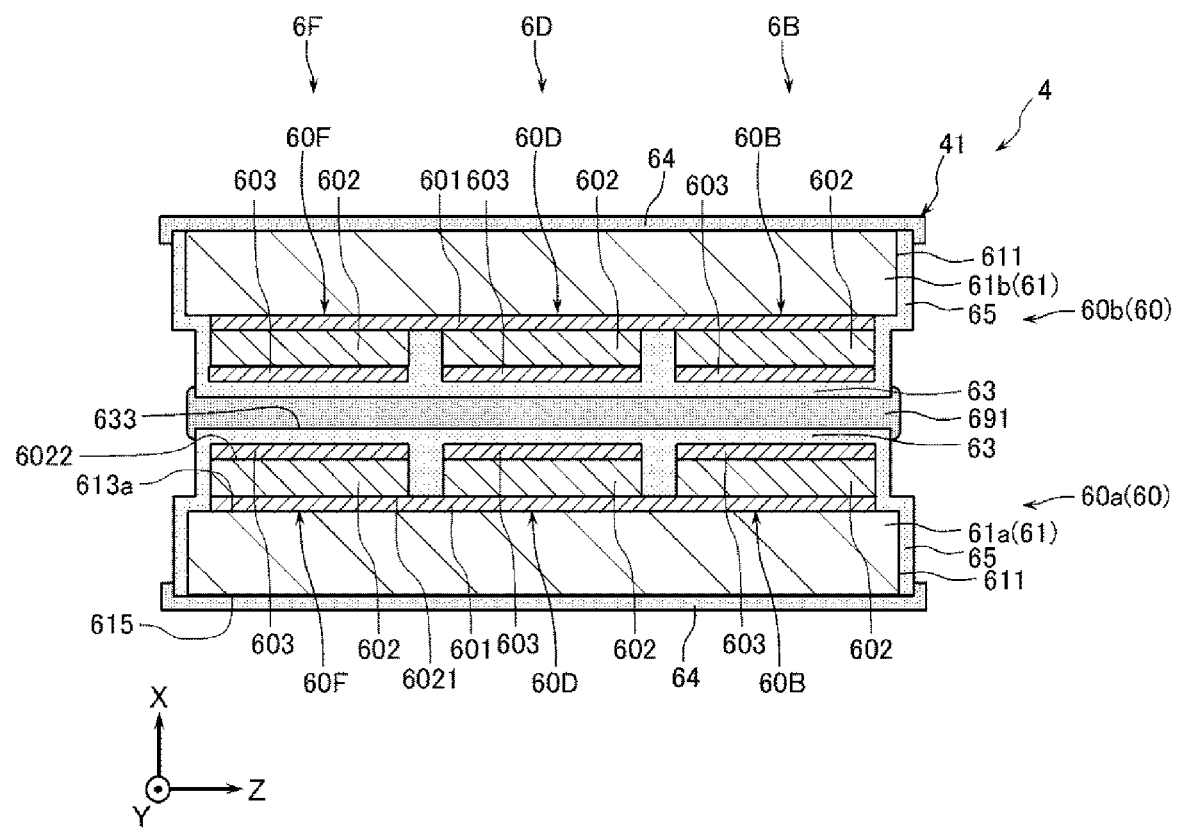
FIG. 6 is a C-C line sectional view of FIGS. 2 and 3.
Figure 7:
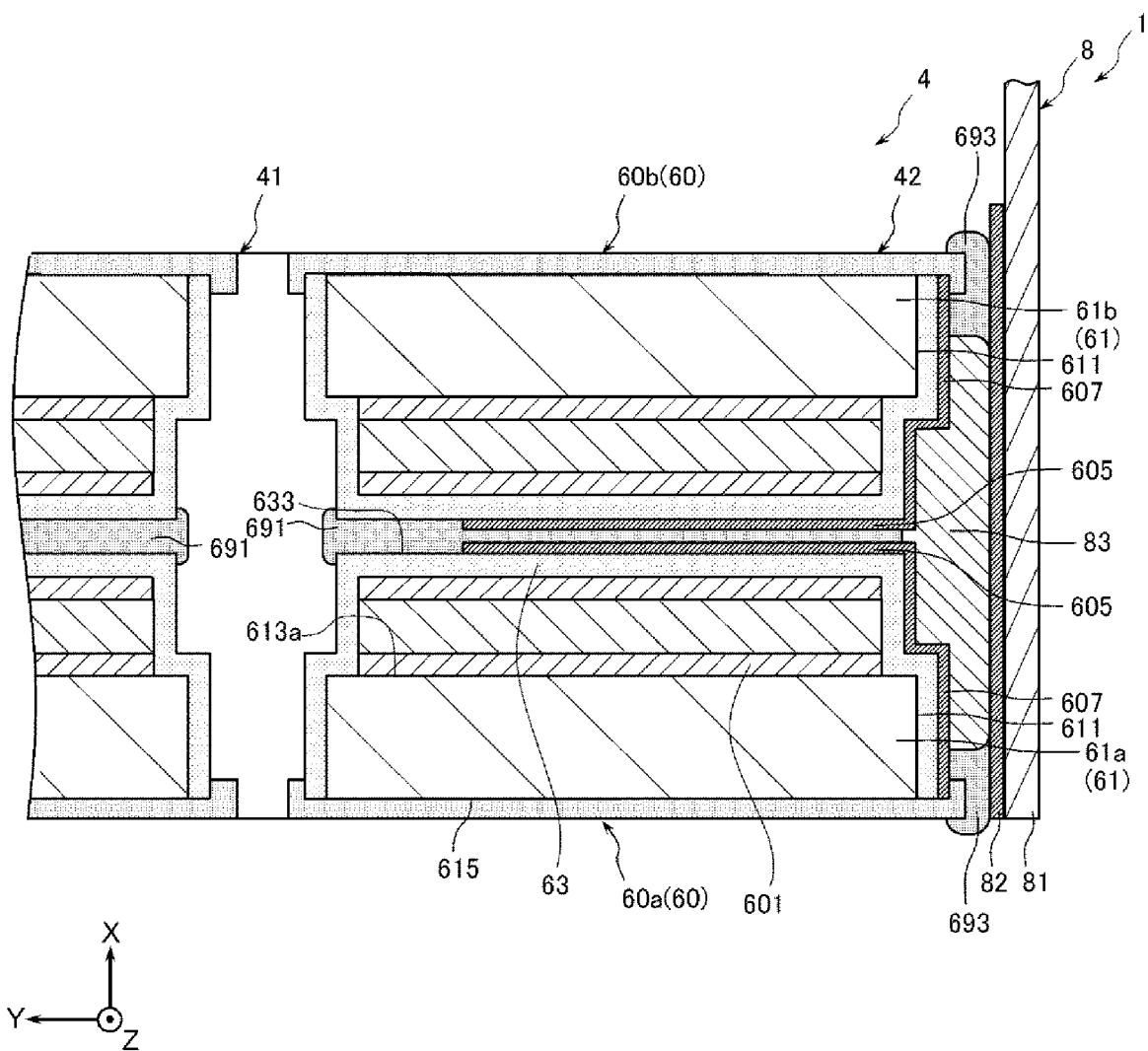
FIG. 7 is an E-E line sectional view of FIGS. 2 and 3.

FIG. 1 is a plan view showing the piezoelectric motor according to the first embodiment. FIGS. 2 and 3 are respectively plan views showing disposition of an electrode of a vibrating body shown in FIG. 1. FIG. 4 is an A-A line sectional view of FIGS. 2 and 3. FIG. 4 is an A-A line sectional view of FIGS. 2 and 3. FIG. 5 is a B-B line sectional view of FIGS. 2 and 3. FIG. 6 is a C-C line sectional view of FIGS. 2 and 3. FIG. 7 is an E-E line sectional view of FIGS. 2 and 3.

In the following explanation, for convenience of explanation, three axes orthogonal to one another are represented as an X axis, a Y axis, and a Z axis. An arrow side of the axes is referred to as "plus side" as well and the opposite side of the arrow is referred to as "minus side" as well.

In the following explanation, "provided on a surface" indicates a state of being directly located on the surface or a state of being indirectly located on the surface via some interposed object.

A piezoelectric motor 1 shown in FIG. 1 includes a rotor 2 functioning as a driven section formed in a disk shape and rotatable around a center axis O and a piezoelectric actuator 3 that is in contact with an outer circumferential surface 21 of the rotor 2. In such a piezoelectric motor 1, when the piezoelectric actuator 3 is vibrated, the rotor 2 rotates around the center axis O parallel to the X axis. The configuration of the piezoelectric motor 1 is not limited to the configuration shown in FIG. 1. For example, a plurality of piezoelectric actuators 3 may be disposed along the circumferential direction of the rotor 2. The rotor 2 may be rotated by driving of the plurality of piezoelectric actuators 3. The piezoelectric actuator 3 may be in contact with a principal plane 22 of the rotor 2 rather than the outer circumferential surface 21 of the rotor 2. The driven section is not limited to a rotating body such as the rotor 2 and may be, for example, a slider that linearly moves.

In the embodiment, an encoder 9 is provided in the rotor 2. A behavior, in particular, a rotation amount and angular velocity of the rotor 2 can be detected by the encoder 9. The encoder 9 is not particularly limited and may be, for example, an incremental encoder that detects a rotation amount of the rotor 2 during the rotation of the rotor 2 or may be an absolute encoder that detects an absolute value from the origin of the rotor 2 irrespective of presence or absence of the rotation of the rotor 2.

The encoder 9 according to this embodiment includes a scale 91 fixed to a surface on the X-axis plus side of the rotor 2 and an optical element 92 provided on the X-axis plus side of the scale 91. The scale 91 is formed in a disk shape. A not-shown pattern is provided on a surface on the X-axis plus side of the scale 91. On the other hand, the optical element 92 includes a light emitting element 921 that irradiates light toward the pattern of the scale 91 and an imaging element 922 that images the pattern of the scale 91. The encoder 9 having such a configuration can detect a rotation amount, driving speed, an absolute position, and the like of the rotor 2 by performing template matching of an image of the pattern acquired by the imaging element 922. However, the configuration of the encoder 9 is not limited to the configuration explained above. For example, the encoder 9 may include, instead of the imaging element 922, a light receiving element that receives reflected light or transmitted light from the scale 91.

1.1.1 Piezoelectric Actuator

The piezoelectric actuator 3 includes a vibrating body 4, an urging member 5 that urges the vibrating body 4 toward the rotor 2, and a control device 7 that controls driving of the vibrating body 4.

The vibrating body 4 includes, as shown in FIGS. 2 and 3, a vibrating section 41, a supporting section 42 that supports the vibrating section 41, a coupling section 43 that couples the vibrating section 41 and the supporting section 42, and a protrusion section 44 that is coupled to the vibrating section 41 and transmits vibration of the vibrating section 41 to the rotor 2.

The length along the X axis of the vibrating section 41 is referred to as "thickness". The vibrating section 41 is formed in a plate shape expanding on a Y-Z plane including the Y axis and the Z axis. The vibrating section 41 bends along the Z axis while expanding and contracting along the Y axis to thereby perform flexural vibrate in an S shape. In plan view along the X axis, the vibrating section 41 is formed in a substantially rectangular shape having a major axis parallel to the Y axis in an expanding and contracting direction of the vibrating section 41. However, the shape of the vibrating section 41 is not particularly limited as long as the vibrating section 41 can exert the function of the vibrating section 41.

As shown in FIG. 3, the vibrating section 41 includes piezoelectric elements 6A to 6F for driving for vibrating the vibrating section 41, a piezoelectric element 6G for detection for detecting the vibration of the vibrating section 41, a distal end face 412, which is an end face on the Y-axis plus side of the vibrating section 41, and a recess 414 opened on the distal end face 412.

The piezoelectric elements 6C and 6D are respectively disposed along the longitudinal direction of the vibrating section 41, that is, the Y axis in the center along the Z axis of the vibrating section 41. The piezoelectric element 6C is located further on the Y-axis plus side than the piezoelectric element 6D. On the other hand, the piezoelectric element 6D is located further on the Y-axis minus side than the piezoelectric element 6C. The piezoelectric element 6G is disposed between the piezoelectric element 6C and the piezoelectric element 6D. The piezoelectric element 6C and the piezoelectric element 6D are electrically coupled to each other.

One piezoelectric element may be provided instead of the two piezoelectric elements 6C and 6D.

On the Z-axis plus side of the vibrating section 41 with respect to the piezoelectric elements 6C and 6D, the piezoelectric elements 6A and 6B are disposed side by side in the longitudinal direction of the vibrating section 41. On the Z-axis minus side, the piezoelectric elements 6E and 6F are disposed side by side in the longitudinal direction of the vibrating section 41. The piezoelectric elements 6A to 6F respectively expand and contract in the longitudinal direction of the vibrating section 41 by being energized. The piezoelectric elements 6A and 6F are electrically coupled to each other. The piezoelectric elements 6B and 6E are electrically coupled to each other. As explained below, it is possible to cause the vibrating section 41 to perform flexural vibration in an S shape within the plane of the vibrating section 41 by applying alternating voltages, phases of which are different from each other and frequencies of which are the same, to the piezoelectric elements 6C and 6D, to the piezoelectric elements 6A and 6F, and to the piezoelectric elements 6B and 6E and shifting expanding and contracting timings of the piezoelectric elements 6C and 6D, the piezoelectric elements 6A and 6F, and the piezoelectric elements 6B and 6E.

The piezoelectric element 6G is located between the piezoelectric element 6C and the piezoelectric element 6D. That is, the piezoelectric element 6G is disposed side by side with the piezoelectric elements 6C and 6D along an expanding and contracting direction of the piezoelectric elements 6C and 6D, that is, the Y axis. The piezoelectric element 6G receives an external force corresponding to vibration of the vibrating section 41 involved in driving of the piezoelectric elements 6A to 6F and outputs a signal corresponding to the received external force. Accordingly, it is possible to detect a vibration state of the vibrating section 41 based on a signal output from the piezoelectric element 6G. "The piezoelectric element 6G is disposed side by side with the piezoelectric elements 6C and 6D along an expanding and contracting direction of the piezoelectric elements 6C and 6D" means that at least a part of the piezoelectric element 6G is located within a region where an extended region of the piezoelectric element 6C in the expanding and contracting direction and an extended region in the expanding and contracting direction of the piezoelectric element 6D overlap and preferably means that the entire piezoelectric element 6G is located within the region.

The piezoelectric element 6G is disposed in a portion forming a node of the flexural vibration of the vibrating section 41. The node of the flexural vibration is a portion where amplitude along the Z axis is substantially zero, that is a portion where the flexural vibration does not substantially occur. In this way, the piezoelectric element 6G is disposed side by side with the piezoelectric elements 6C and 6D in the expanding and contracting direction of the piezoelectric elements 6C and 6D and is disposed in a portion including the node of the flexural vibration of the vibrating section 41. Consequently, expanding and contracting vibration along the Y axis of the vibrating section 41 is easily transmitted to the piezoelectric element 6G and flexural vibration along the Z axis of the vibrating section 41 is less easily transmitted. That is, it is possible to reduce sensitivity of the flexural vibration while improving sensitivity of the expanding and contracting vibration. Accordingly, the expanding and contracting vibration along the Y axis of the vibrating section 41 can be more accurately detected by the piezoelectric element 6G.

However, the disposition of the piezoelectric element 6G is not particularly limited if the expanding and contracting vibration along the Y axis of the vibrating section 41 can be detected. For example, the piezoelectric element 6G may be disposed in a portion forming an antinode of the flexural vibration of the vibrating section 41. The piezoelectric element 6G may be divided into a plurality of elements.

The supporting section 42 supports the vibrating section 41. In plan view along the X axis, the supporting section 42 is formed in a U shape surrounding the proximal end side, that is, the Y-axis minus side of the vibrating section 41. However, the shape and the disposition of the supporting section 42 are not particularly limited as long as the function of the supporting section 42 can be exerted.

The coupling section 43 couples the portion forming the node of the flexural vibration of the vibrating section 41, specifically, the center along the Y axis of the vibrating section 41 and the supporting section 42. However, the configuration of the coupling section 43 is not particularly limited as long as the coupling section 43 can exert the function of the coupling section 43.

The vibrating section 41, the supporting section 42, the coupling section 43 explained above have a configuration in which two piezoelectric element units 60 are faced to each other and pasted as shown in FIGS. 4 to 6. That is, in the sectional views of FIGS. 4 to 6, the configuration of the piezoelectric element units 60 satisfies a relation of a mirror image with respect to a line passing the middle of the piezoelectric element units 60.

The piezoelectric element units 60 is configured by laminated bodies, each of which are formed by laminating a plurality of layers. These layers are a piezoelectric body, an electrode, a wiring layer, and an insulating film explained below.

FIGS. 2 and 3 are plan views of the layers of the laminated bodies respectively configuring the piezoelectric element units 60. The layers shown in FIGS. 2 and 3 are electrically insulated via not-shown insulating films.

First, a first electrode 601 shown in FIG. 2 is an electrode provided on a first front surface 613a, which is a surface on the X-axis plus side of a vibrating plate 61, and common to the piezoelectric elements 6A to 6G.

Six second electrodes 603 shown in FIG. 3 are individual electrodes of the piezoelectric elements 6A to 6F. One third electrode 604 shown in FIG. 3 is an individual electrode of the piezoelectric element 6G. The second electrodes 603 and the third electrode 604 are respectively disposed to be opposed to the first electrode 601 via piezoelectric bodies 602 explained below.

The first electrode 601, the second electrodes 603, and the third electrode 604 are respectively drawn around to an end portion on the Y-axis minus side of the supporting section 42 via not-shown wires.

FIGS. 4 to 6 are sectional views of the vibrating section 41 shown in FIG. 2 or FIG. 3 explained above. The positions of cut sections of the sectional views are different from one another. In the following explanation, of the two piezoelectric element units 60 shown in FIGS. 4 to 6, the piezoelectric element unit 60 located on the X-axis minus side of the figures is representatively explained.

The piezoelectric element unit 60 shown in FIGS. 4 to 6 includes the vibrating plate 61, piezoelectric elements 60A, 60B, 60C, 60D, 60E, and 60F for driving and a piezoelectric element 60G for detection disposed on the first front surface 613a of the vibrating plate 61, a first insulating film 63 that covers the piezoelectric elements 60A to 60G, a second insulating film 64 that covers a first rear surface 615, which is a surface on the X-axis minus side of the vibrating plate 61, and a third insulating film 65 that covers an end face 611 of the vibrating plate 61.

The piezoelectric elements 60A to 60F respectively include, as shown in FIGS. 4 to 6, the first electrode 601 disposed on the first front surface 613a of the vibrating plate 61, piezoelectric bodies 602 disposed on a surface on the X-axis plus side of the first electrode 601, and the second electrodes 603 disposed on a surface on the X-axis plus side of the piezoelectric bodies 602. That is, the first electrode 601 are provided on surfaces 6021 on the X-axis minus side of the piezoelectric bodies 602. The second electrodes 603 are provided on surfaces 6022 on the X-axis plus side of the piezoelectric bodies 602. The second electrodes 603 are electrodes for driving that vibrate, based on a driving signal, the piezoelectric bodies 602 of the piezoelectric elements 60A to 60F for driving.

The piezoelectric element 60G includes, as shown in FIG. 5, the first electrode 601 disposed on the first front surface 613a of the vibrating plate 61, the piezoelectric body 602 disposed on the surface on the X-axis plus side of the first electrode 601, and the third electrode 604 disposed on the surface on the X-axis plus side of the piezoelectric body 602. That is, the first electrode 601 is provided on the surface 6021 on the X-axis minus side of the piezoelectric body 602. The third electrode 604 is provided on the surface 6022 on the X-axis plus side of the piezoelectric body 602. The third electrode 604 is an electrode for detection that outputs a detection signal corresponding to vibration of the piezoelectric body 602 of the piezoelectric element 60G for detection to the control device 7 explained below.

The two piezoelectric element units 60 are joined via an adhesive 691 in a state in which surfaces on a side on which the piezoelectric elements 60A to 60G are disposed are opposed to each other. By pasting together a plurality of piezoelectric element units 60 in this way, it is possible to increase an output of the piezoelectric motor 1.

Examples of the adhesive 691 include an epoxy adhesive, a silicone adhesive, a urethane adhesive, and an acrylic adhesive. Among the adhesives, the epoxy adhesive is preferably used from the viewpoints of adhesive strength, heat resistance, and the like.

The first electrode 601 shown in the figures is an electrode common to the piezoelectric elements 6A to 6G. However, the first electrode 601 is not limited to this and may be divided for each of the piezoelectric elements and coupled to one another by wires or the like.

The first insulating film 63 shown in FIGS. 4 to 6 is provided to cover the piezoelectric elements 60A to 60G. The second insulating film 64 shown in FIGS. 4 to 6 is provided to cover the first rear surface 615 of the vibrating plate 61. Further, the third insulating film 65 shown in FIGS. 4 to 6 is provided to cover the end face 611 of the vibrating plate 61. Since the third insulating film 65 is an insulating film continuous from the first insulating film 63, the third insulating film 65 also covers end faces of the piezoelectric elements 60A to 60G. As a result, the first insulating film 63 and the third insulating film 65 are formed as one film and cover an entire structure located on the X-axis plus side of the vibrating plate 61. Consequently, insulation and weather resistance can be improved. The vibrating body 4 having high reliability can be obtained.

A wiring layer 605 shown in FIG. 7 is electrically coupled to the first electrode 601 shown in FIGS. 4 to 6 via a not-shown contact. Although not shown in the figure, a wiring layer electrically coupled to each of the second electrodes 603 and the third electrode 604 is also provided.

The wiring layer 605 is drawn around on a surface 633 on the X-axis plus side of the first insulating film 63 and further drawn around to an end portion on the Y-axis minus side of the supporting section 42.

The piezoelectric element unit 60 shown in FIG. 7 further includes a wiring layer 607 provided on the end face 611 of the vibrating plate 61. The wiring layer 607 is a wiring layer continuous from the wiring layer 605. Therefore, the first electrode 601 of the piezoelectric elements 60A to 60G is drawn out onto the end face 611 of the vibrating plate 61 through the wiring layers 605 and 607.

By providing such a wiring layer 607, in the piezoelectric element unit 60, it is possible to achieve electric coupling to the outside on the end face 611 rather than on the first front surface 613a, which is the surface on the X-axis plus side of the vibrating plate 61, and on the first rear surface 615, which is the surface on the X-axis minus side.

In FIG. 7, a state in which the piezoelectric element unit 60 is electrically coupled to a wiring board 8 is also shown. The wiring board 8 shown in FIG. 7 is a wiring plate that electrically couples the piezoelectric element unit 60 and the control device 7 shown in FIG. 1. The wiring board 8 includes a flexible board 81 and a wire 82 provided on one surface of the flexible board 81. A plurality of wires 82 are drawn around to correspond to the wiring layer 607 included in the piezoelectric element unit 60. A rigid board may be used instead of the flexible board 81.

The piezoelectric motor 1 shown in FIG. 7 includes the two piezoelectric element units 60 stacked each other. The piezoelectric element units 60 are electrically coupled to the wiring board 8 via the wiring layers 607 provided on the end faces 611 of the vibrating plate 61. Accordingly, even when the plurality of piezoelectric element units 60 are stacked, it is possible to collectively couple the stacked piezoelectric element units 60 and the wiring board 8. Accordingly, it is unnecessary to achieve the coupling to the wiring board 8 while stacking the piezoelectric element unit 60 one by one. It is possible to markedly improve work efficiency of electric coupling.

Further, in the piezoelectric motor 1 shown in FIG. 7, the piezoelectric element units 60 and the wiring board 8 are electrically coupled via a conductive member 83.

Examples of the conductive member 83 include conductive metal such as solder, a blazing material, and metal paste, anisotropic conductive materials such as anisotropic conductive paste and an anisotropic conductive sheet, a conductive adhesive, and a wire bonding material.

In FIG. 7, in addition to the conductive material 83, the piezoelectric element units 60 and the wiring board 8 are bonded via an adhesive 693. Consequently, it is possible to more surely couple the piezoelectric element units 60 and the wiring board 8.

Of the two piezoelectric element units 60 shown in FIG. 7, the lower piezoelectric element unit 60 is represented as a "first piezoelectric element unit 60a" and the upper piezoelectric element unit 60 is represented as a "second piezoelectric element unit 60b".

In FIG. 7, the first piezoelectric element unit 60a and the second piezoelectric element unit 60b are stacked via the adhesive 691. The piezoelectric elements 60A are coupled via the conductive member 83 between the first piezoelectric element unit 60a and the second piezoelectric element unit 60b. Consequently, the "piezoelectric element 6A" is configured from two piezoelectric elements 60A.

The same applies to the other piezoelectric elements 60B to 60G. The "piezoelectric element 6B" is configured from two piezoelectric elements 60B. The "piezoelectric element 6C" is configured from two piezoelectric elements 60C. The "piezoelectric element 6D" is configured from two piezoelectric elements 60D. The "piezoelectric element 6E" is configured from two piezoelectric elements 60E. The "piezoelectric element 6F" is configured from two piezoelectric elements 60F. The "piezoelectric element 6G" is configured from two piezoelectric elements 60G.

A constituent material of the piezoelectric body 602 is not particularly limited. For example, piezoelectric ceramics such as lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, and lead scandium niobate can be used. As the piezoelectric body 602, besides the piezoelectric ceramics, polyvinylidene fluoride, quartz, and the like may be used.

The piezoelectric body 602 may be a bulk body or a thin film body configured by a sol-gel method or a sputtering method. In this embodiment, the piezoelectric body 602 is formed using the sol-gel method. That is, the piezoelectric elements 60A to 60G according to this embodiment include the piezoelectric body 602 in contact with the first electrode 601, the second electrode 603, and the third electrode 604. The piezoelectric body 602 is a thin film body. Consequently, for example, the piezoelectric body 602 that is thin compared with when the piezoelectric body 602 is the bulk body is obtained. A reduction in the thickness of the piezoelectric actuator 3 can be achieved. As explained below, since the piezoelectric element unit 60 can be manufactured using a semiconductor manufacturing technique, it is possible to improve manufacturing efficiency and achieve a cost reduction.

Figure 8:
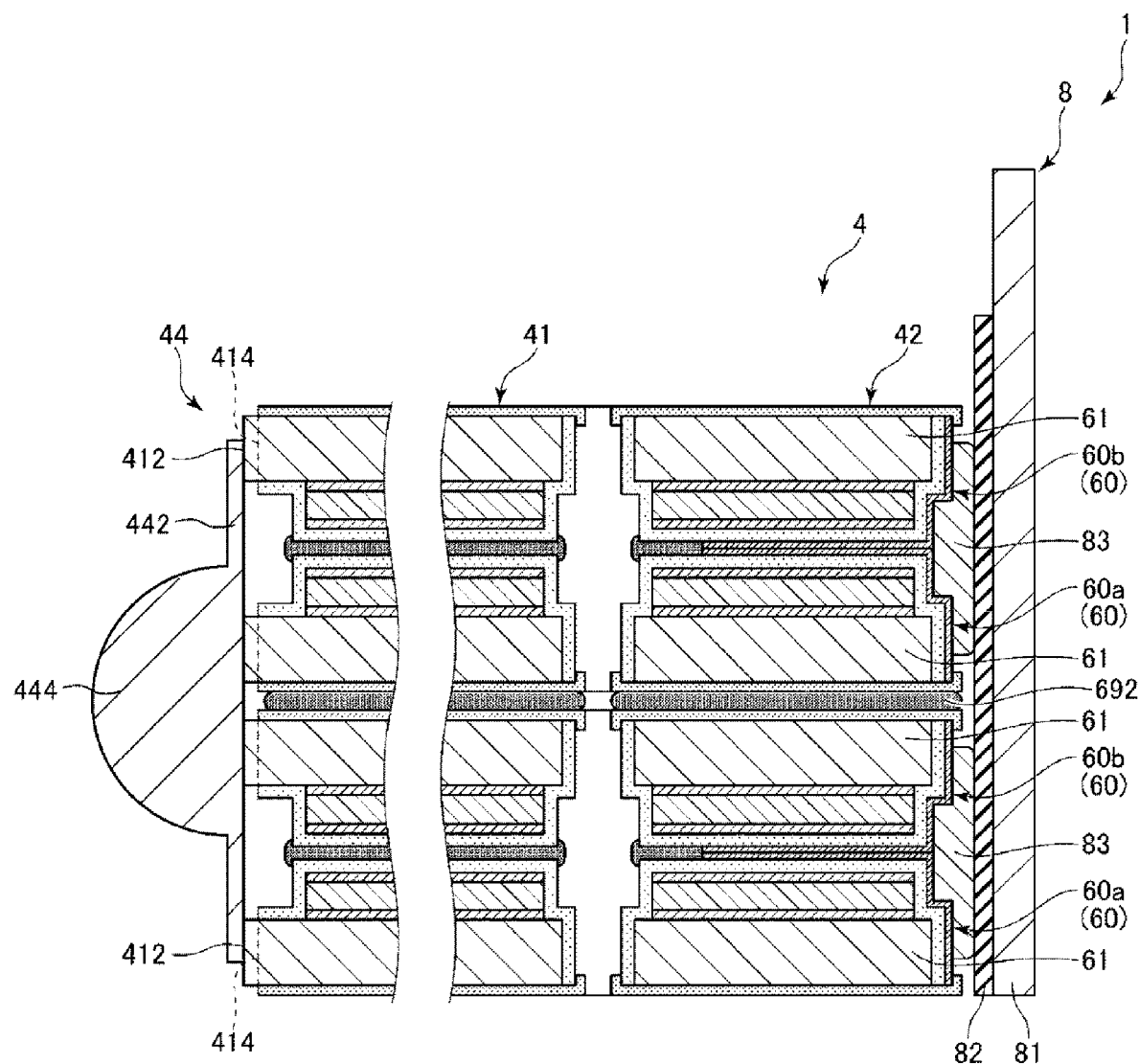
FIG. 8 is a sectional view showing a state in which four piezoelectric element units shown in FIG. 7 are stacked and then electrically coupled to a wiring board.

FIG. 8 is a sectional view showing a state in which a quartet of the piezoelectric element units 60 shown in FIG. 7 are stacked and then electrically coupled to the wiring board 8.

The piezoelectric motor 1 shown in FIG. 8 includes two stack units. Specifically, first, the two piezoelectric element units 60 are stacked via the adhesive 691 shown in FIG. 7, whereby one stack unit is formed. Further, the stack units are bonded via an adhesive 692, whereby a stack structure formed by stacking four piezoelectric element units 60 is obtained. The stack structure becomes the vibrating section 41, the supporting section 42, and the coupling section 43 explained above. Then, the piezoelectric element units 60 are electrically coupled to the wiring board 8 via the conductive member 83.

It is possible to realize the piezoelectric motor 1 that can generate a particularly high output by including the plurality of piezoelectric element units 60 in this way.

The adhesive 692 is not particularly limited. For example, the adhesive 692 is selected out of the examples of the adhesive 691 described above.

Examples of a first vibrating plate 61a and a second vibrating plate 61b include a silicon substrate, a silicon carbide substrate, and a compound semiconductor substrate. The first vibrating plate 61a or the second vibrating plate 61b is preferably a silicon substrate. Consequently, when the first piezoelectric element unit 60a or the second piezoelectric element unit 60b is manufactured, a silicon semiconductor manufacturing technology can be applied. Accordingly, it is possible to efficiently and highly accurately manufacture the first piezoelectric element unit 60a or the second piezoelectric element unit 60b.

The protrusion section 44 is provided at the distal end of the vibrating section 41 and projects to the Y-axis plus side from the vibrating section 41. In the following explanation, an end face on the Y-axis plus side of the vibrating section 41 is referred to as "distal end".

The protrusion section 44 shown in FIG. 8 is fixed to the stack structure formed by stacking the four piezoelectric element units 60, that is, the distal end face 412 of the vibrating section 41. The protrusion section 44 is in contact with the outer circumferential surface 21 of the rotor 2. Therefore, the vibration of the vibrating section 41 is transmitted to the rotor 2 via the protrusion section 44.

Figure 9:
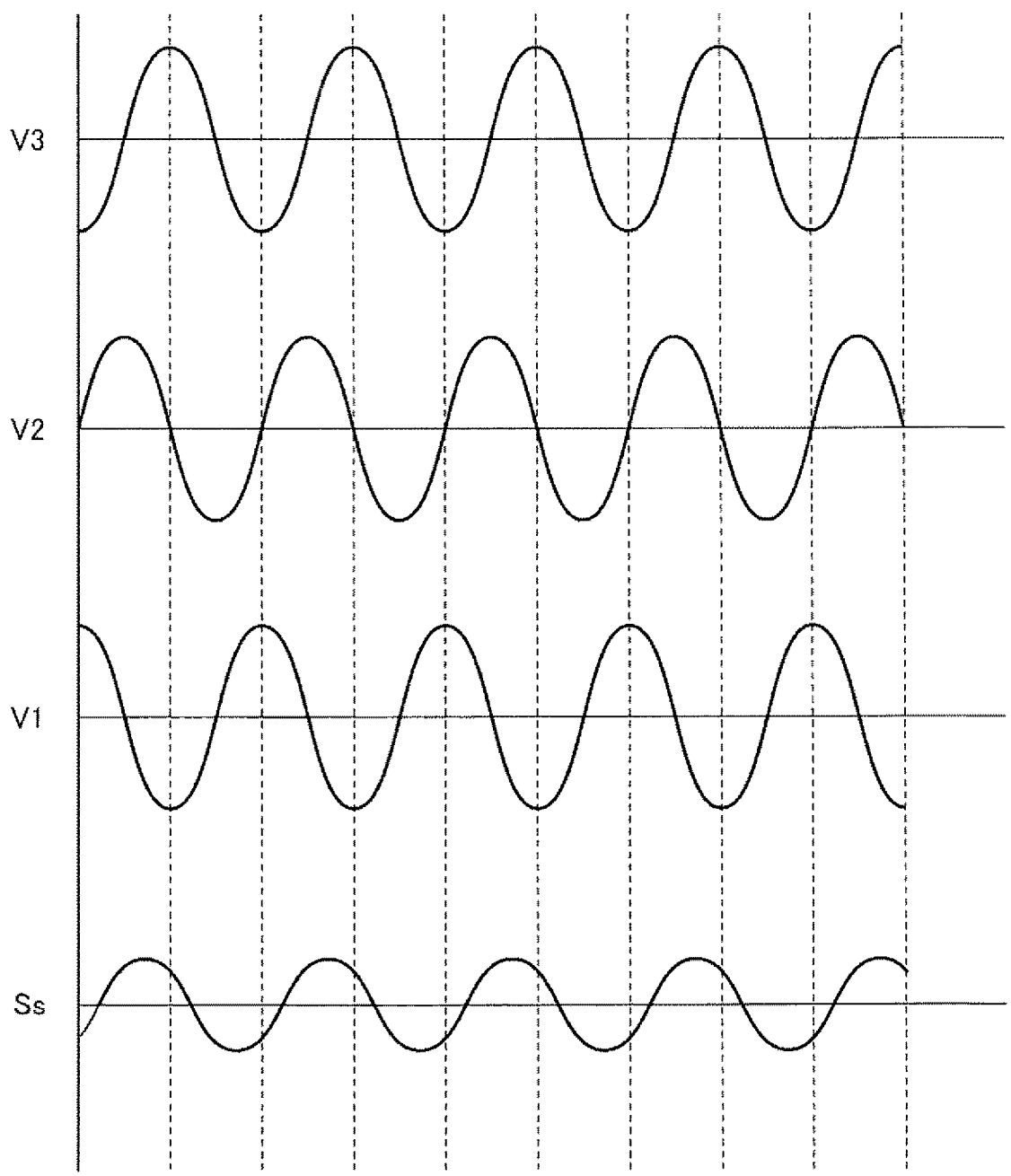
FIG. 9 is a diagram showing an example of alternating voltages applied to a vibrating section shown in FIG. 3.
Figure 10:
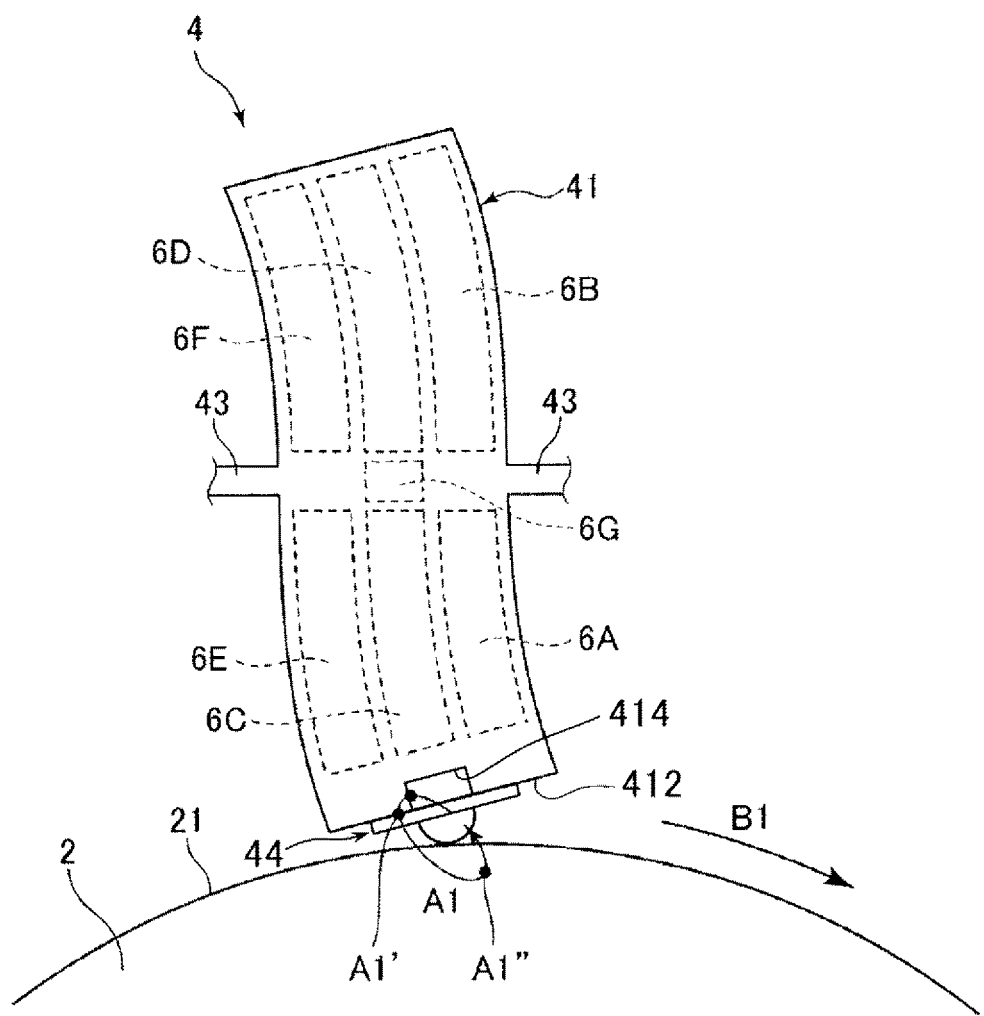
FIG. 10 is a plan view showing a driving state of the vibrating section shown in FIG. 1.
Figure 10:
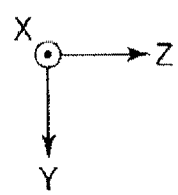
Figure 11:
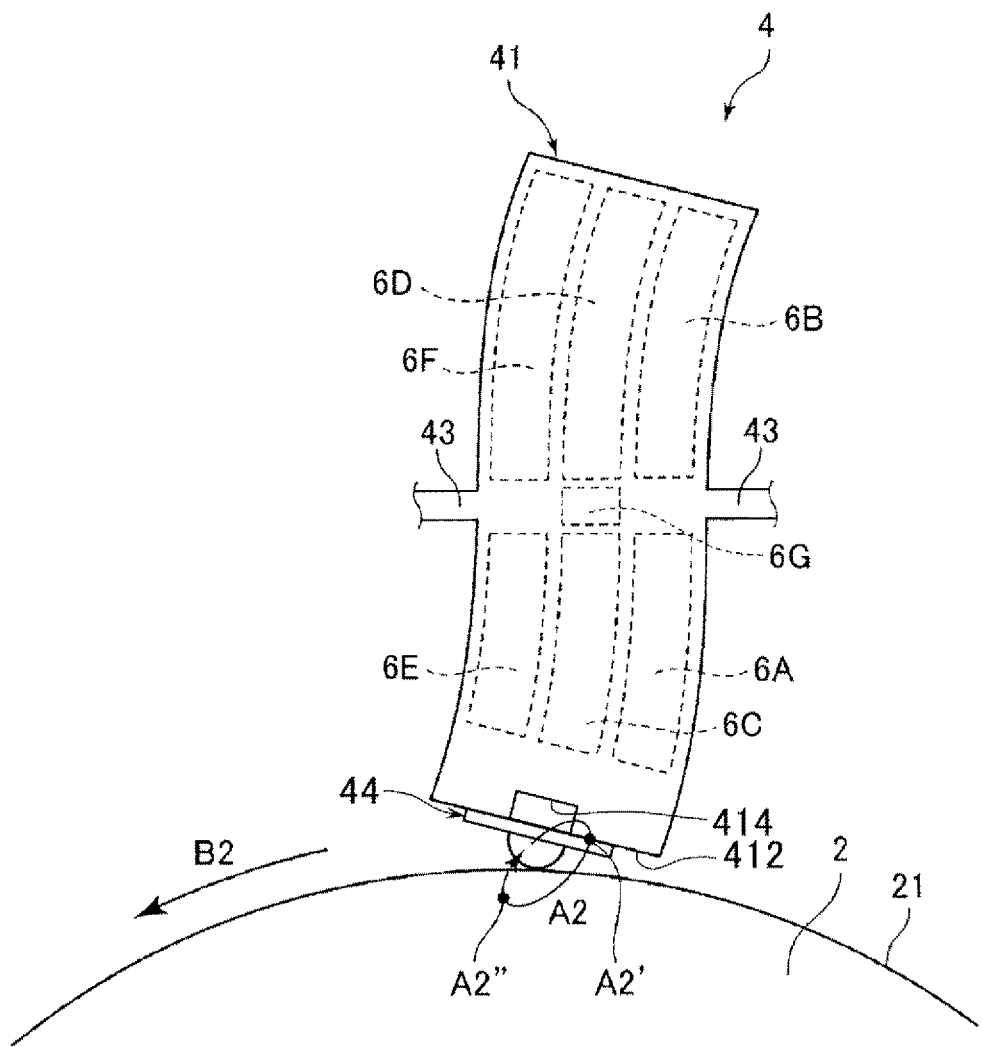
FIG. 11 is a plan view showing the driving state of the vibrating section shown in FIG. 1.
Figure 11:
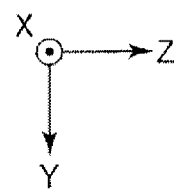
Figure 12:
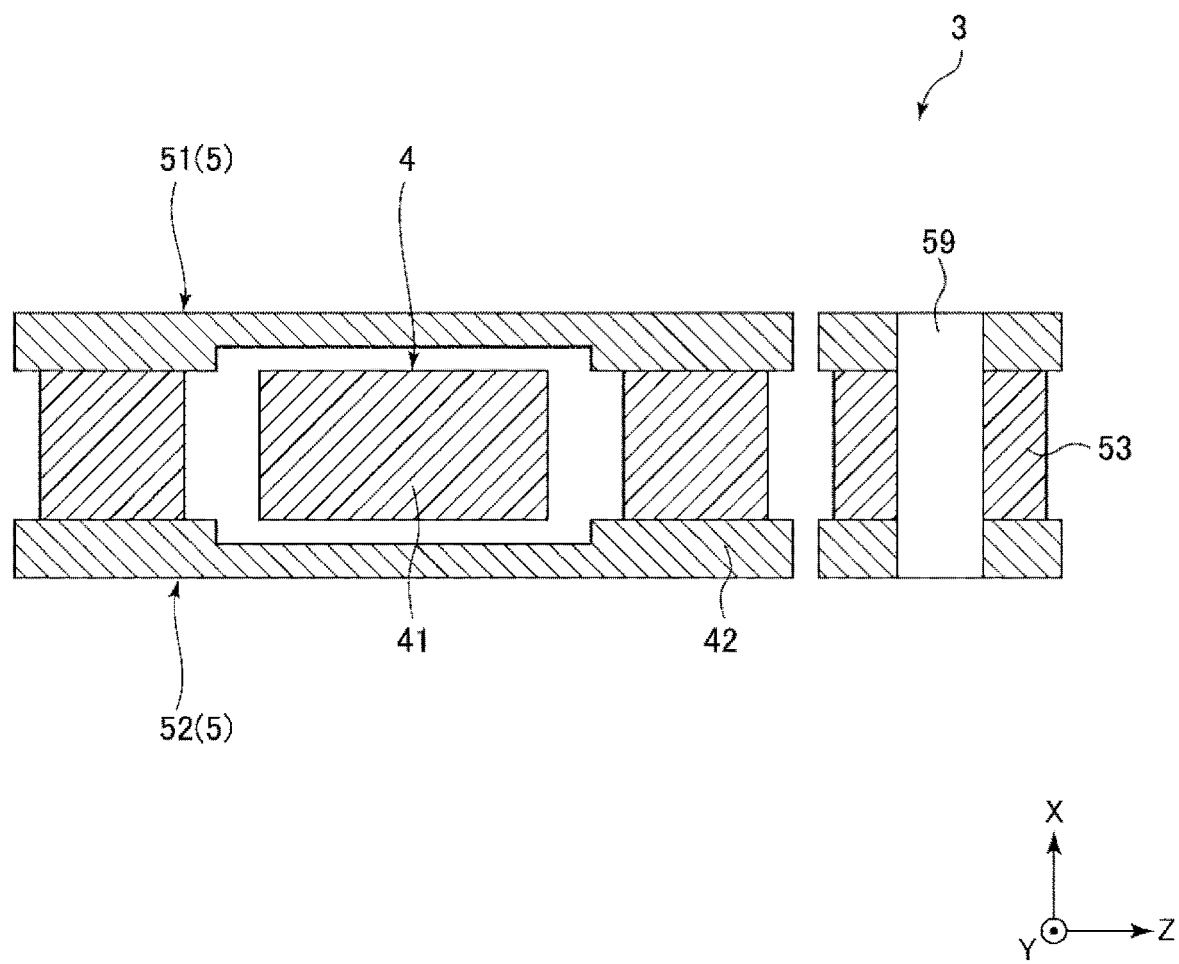
FIG. 12 is an F-F line sectional view shown in FIG. 1.

FIG. 9 is a diagram showing an example of alternating voltages applied to the vibrating section shown in FIG. 3. FIGS. 10 and 11 are respectively plan views showing a driving state of the vibrating section shown in FIG. 1. FIG. 12 is an F-F line sectional view in FIG. 1.

In such a vibrating body 4, when an alternating voltage V1 shown in FIG. 9 is applied to the piezoelectric elements 6A and 6F, an alternating voltage V2 is applied to the piezoelectric elements 6C and 6D, and an alternating voltage V3 is applied to the piezoelectric elements 6B and 6E, as shown in FIG. 10, the vibrating section 41 performs flexural vibration along the Z axis while performing expanding and contracting vibration along the Y axis. At this time, the alternating voltage V2 applied to the piezoelectric elements 6C and 6D causes the vibrating section 41 to generate expanding and contracting vibration. On the other hand, the alternating voltage V1 applied to the piezoelectric elements 6A and 6F and the alternating voltage V3 applied to the piezoelectric elements 6B and 6E cause the vibrating section 41 to generate flexural vibration. When these vibrations are combined, the distal end of the protrusion section 44 performs an elliptical motion that draws an elliptical track counterclockwise as indicated by an arrow A1. Therefore, the alternating voltages V1, V2, and V3 are driving signals in the piezoelectric actuator 3. The rotor 2 is sent out by the elliptical motion of the protrusion section 44. The rotor 2 rotates clockwise as indicated by an arrow B1. A detection signal $S_S$ is output from the piezoelectric element 6G according to the vibration of the vibrating section 41.

In the elliptical motion of the protrusion section 44 indicated by the arrow A1 in FIG. 10, from a point A1' to a point A1", the protrusion section 44 comes into contact with the outer circumferential surface 21 of the rotor 2 and sends out the rotor 2 in the direction of the arrow B1. From the point A1" to the point A1', the protrusion section 44 is separated from the outer circumferential surface 21 of the rotor 2. Accordingly, from the point A1" to the point A1', rotation of the rotor 2 to the opposite side of the arrow B1 is suppressed.

When the alternating voltages V1 and V3 are switched to each other, that is, when the alternating voltage V1 is applied to the piezoelectric elements 6B and 6E, the alternating voltage V2 is applied to the piezoelectric elements 6C and 6D, and the alternating voltage V3 is applied to the piezoelectric elements 6A and 6F, as shown in FIG. 11, the vibrating section 41 performs flexural vibration along the Z axis while performing expanding and contracting vibration along the Y axis. At this time as well, the alternating voltage V2 applied to the piezoelectric elements 6C and 6D causes the vibrating section 41 to generate expanding and contracting vibration. On the other hand, the alternating voltage V1 applied to the piezoelectric elements 6B and 6E and the alternating voltage V3 applied to the piezoelectric elements 6A and 6F cause the vibrating section 41 to generate flexural vibration. When these vibrations are combined, the protrusion section 44 performs an elliptical motion clockwise as indicated by an arrow A2. The rotor 2 is sent out by such an elliptical motion of the protrusion section 44. The rotor 2 rotates counterclockwise as indicated by an arrow B2. The detection signal $S_S$ is output from the piezoelectric element 6G according to such vibration of the vibrating section 41.

In the elliptical motion of the protrusion section 44 indicated by the arrow A2 in FIG. 11, from a point A2' to a point A2", the protrusion section 44 comes into contact with the outer circumferential surface 21 of the rotor 2 and sends out the rotor 2 in the direction of the arrow B2. From the point A2" to the point A2', the protrusion section 44 is separated from the outer circumferential surface 21 of the rotor 2. Accordingly, from the point A2" to the point A2', rotation of the rotor 2 to the opposite direction of the arrow B2 is suppressed.

If the rotor 2 can be rotated at least in one direction, patterns of alternating voltages applied to the piezoelectric elements 6A to 6F are not limited to the patterns shown in FIG. 9. Voltages applied to the piezoelectric elements 6A to 6F may be, for example, intermittently applied DC voltages rather than the alternating voltages.

As explained above, the vibrating section 41 includes the piezoelectric elements 6A to 6F (piezoelectric elements for driving) including the piezoelectric bodies 602 and the first electrodes 601 and the second electrodes 603 provided in the piezoelectric bodies 602. The expanding and contracting vibration and the flexural vibration in the vibrating section 41 are respectively vibrations in a direction parallel to the interfaces between the piezoelectric bodies 602 and the first electrodes 601, that is, the surfaces of the first electrode 601. The vibrating section 41 causes, with the vibrations, the protrusion section 44 to perform an elliptical motion to drive the rotor 2, which is the driven section.

Such vibration on a plane has high vibration efficiency in the vibrating section 41. It is possible to realize the piezoelectric motor 1 with small power consumption.

"Parallel" in this specification is a concept indicating, in addition to a state in which an angle formed with a target line or surface is 0°, a state in which the angle is within a range of ±5°.

The urging member 5 is a member that urges the protrusion section 44 toward the outer circumferential surface 21 of the rotor 2. The urging member 5 includes, as shown in FIG. 12, a first substrate 51 located on the X-axis plus side of the vibrating body 4 and a second substrate 52 located on the X-axis minus side of the vibrating body 4. The first substrate 51 and the second substrate 52 sandwich the vibrating body 4. The first substrate 51 and the second substrate 52 are not particularly limited. For example, a silicon substrate can be used.

As shown in FIG. 12, a spacer 53 having thickness equal to the thickness of the vibrating body 4 is provided between the first substrate 51 and the second substrate 52. A through-hole 59 piercing through the portion along the X direction is formed in the portion. The urging member 5 is screwed to a housing or the like using the through-hole 59. By fixing the urging member 5 to the housing or the like in a state in which a spring section 513 shown in FIG. 1 is bent along the Y axis, it is possible to urge the protrusion section 44 toward the outer circumferential surface 21 of the rotor 2 using a restoring force of the spring section 513.

The configuration of the urging member 5 is not particularly limited if the urging member 5 can urge the protrusion section 44 toward the outer circumferential surface 21 of the rotor 2. For example, one of the first substrate 51 and the second substrate 52 may be omitted. For example, a coil spring, a leaf spring, or the like may be used as the urging member 5.

The control device 7 adjusts, as appropriate, the alternating voltages V1, V2, and V3 applied to the piezoelectric elements 6A to 6F to thereby control driving of the rotor 2 by the vibrating body 4 as shown in FIG. 1.

The control device 7 is configured by a computer including a processor such as a CPU, a memory, and an interface. The control device 7 executes, with the processor, a predetermined program stored in the memory to control the operations of the sections. The program may be downloaded from the outside via the interface. All or a part of the components of the control device 7 may be provided on the outside of the piezoelectric motor 1 and coupled via a communication network such as a LAN (local area network).

1.1.2 Protrusion Section

The protrusion section 44 is explained in detail.

Figure 13:
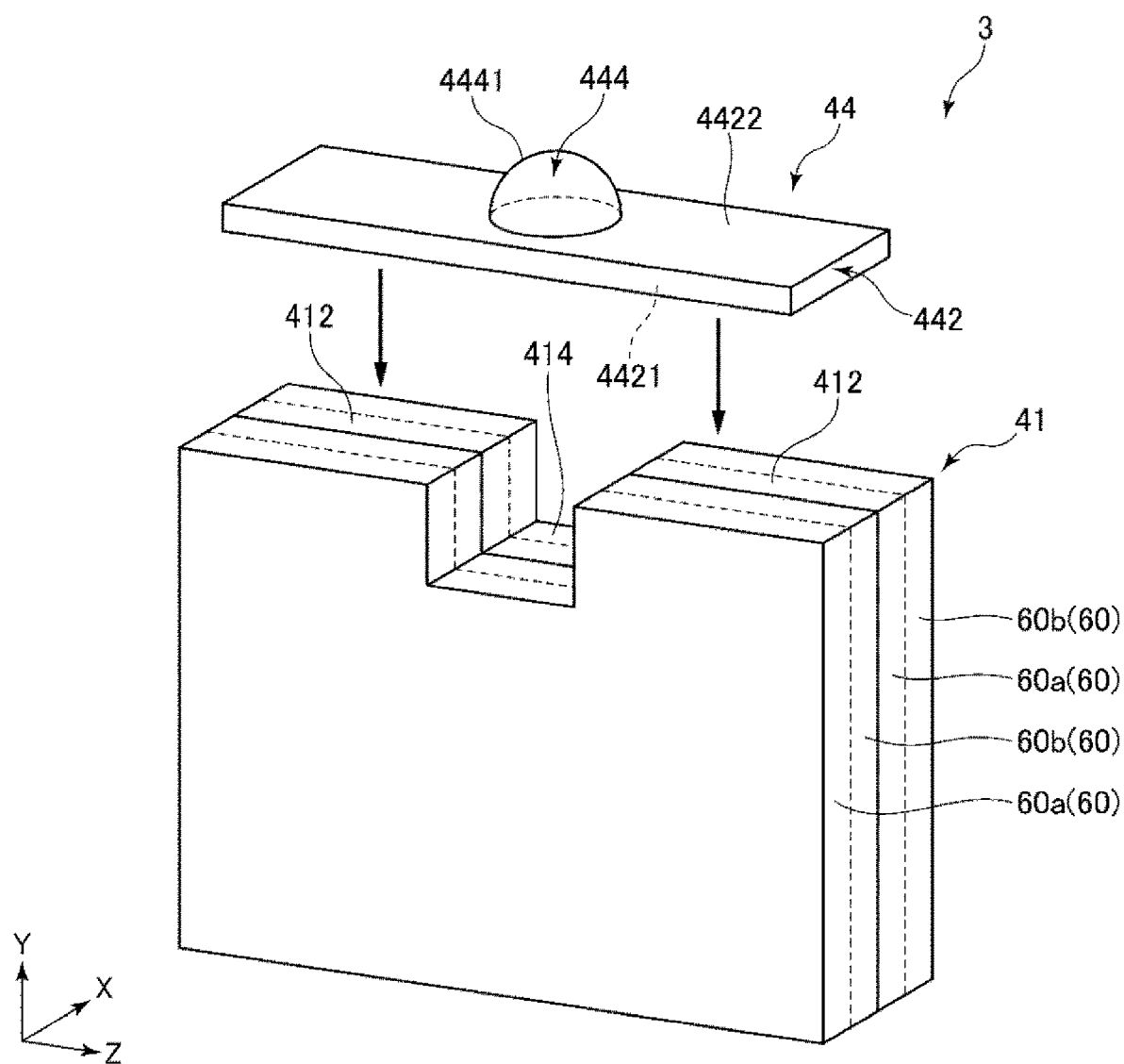
FIG. 13 is an exploded partially enlarged perspective view showing the vibrating section shown in FIG. 8 and a protrusion section attached to the vibrating section.
Figure 14:
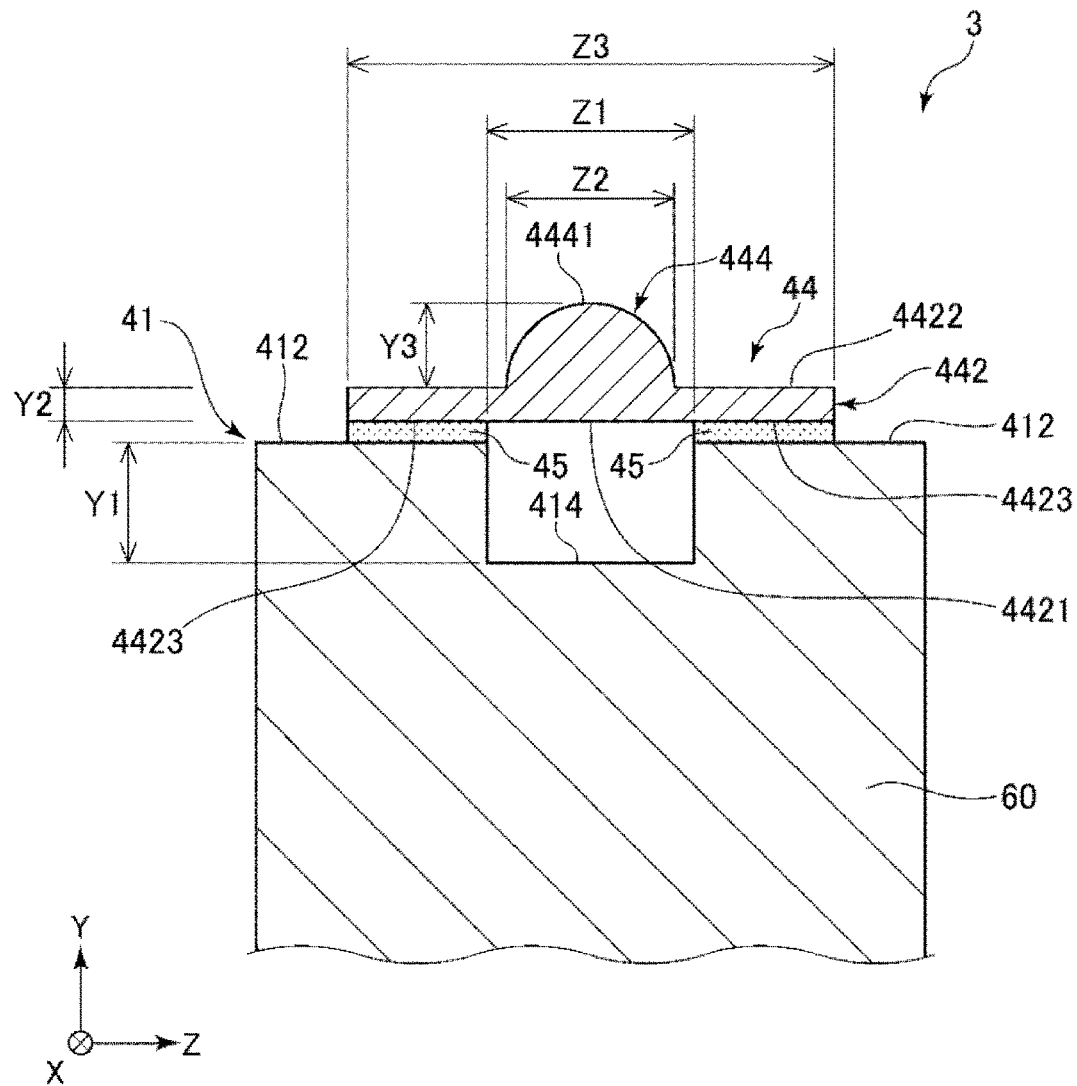
FIG. 14 is a sectional view showing a state in which the protrusion section shown in FIG. 13 is attached to the vibrating section.
Figure 15:
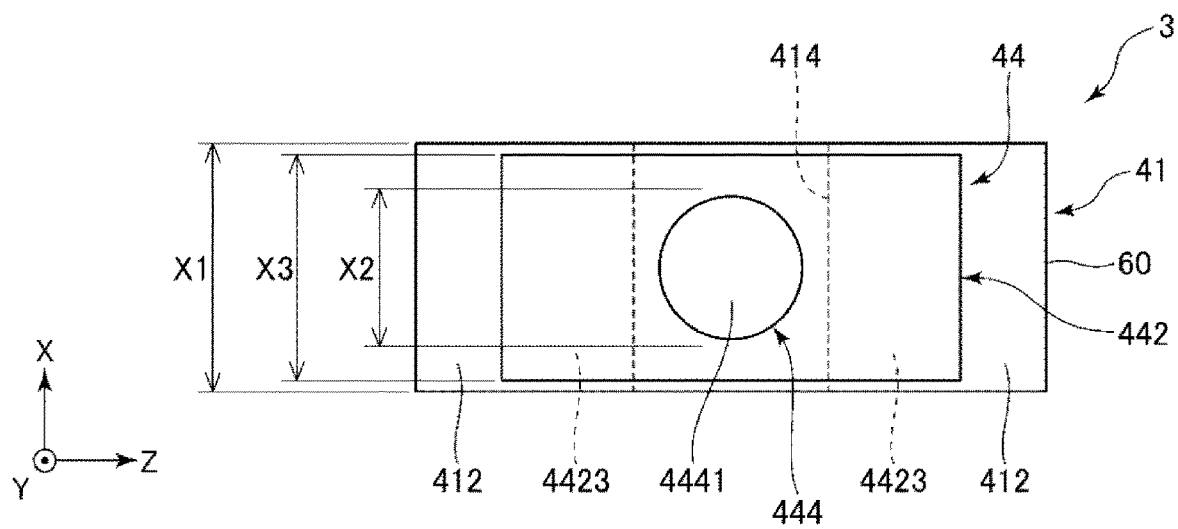
FIG. 15 is a plan view of the protrusion section and the vibrating section shown in FIG. 14 viewed from a Y-axis plus side.

FIG. 13 is an exploded partially enlarged perspective view of the vibrating section 41 shown in FIG. 8 and the protrusion section 44 attached to the vibrating section 41. FIG. 14 is a sectional view showing a state in which the protrusion section 44 shown in FIG. 13 is attached to the vibrating section 41. FIG. 15 is a plan view of the protrusion section 44 and the vibrating section 41 shown in FIG. 14 viewed from the Y-axis plus side. In FIG. 15, the protrusion section 44 is seen through and shown.

As explained above, the vibrating section 41 shown in FIG. 13 includes the stack structure formed by stacking the four piezoelectric element units 60. The vibrating section 41 includes the distal end face 412, which is the end face on the Y-axis plus side, and the recess 414 opened on the distal end face 412. The recess 414 shown in FIG. 13 is a recess provided in the center of the length along the Z axis of the vibrating section 41 and having a depth direction on the Y-axis minus side from the distal end face 412. The recess 414 shown in FIG. 13 is a groove extending along the X axis cut out to pierce through the stacked four piezoelectric element units 60. A sectional shape of the recess 414 taken along the Y-Z plane is formed in a rectangular shape. The position along the Z axis of the recess 414 is preferably the center of the vibrating section 41 but may be a position other than the center. The sectional shape of the recess 414 may be a shape other than the rectangular shape, for example, a triangular shape, a square shape, a trapezoidal shape, a polygonal shape such as a pentagonal shape, a semicircular shape, or other shapes.

The protrusion section 44 shown in FIG. 13 includes a base 442 and a projection 444. The protrusion section 44 transmits a driving force of the vibrating section 41 to the rotor 2.

In plan view of the distal end face 412, the base 442 is located on the inner side of the outer shape of the vibrating section 41 and formed in a tabular shape overlapping the recess 414. The base 442 includes, as two planes that are in a front-rear relation each other, a first surface 4421 on the distal end face 412 side and a second surface 4422 opposite to the first surface 4421. The base 442 is disposed to extend across the recess 414. The first surface 4421 and the distal end face 412 located on both sides of the recess 414 along the Z axis are bonded via an adhesive 45 as shown in FIG. 14.

The second surface 4422 is formed in a rectangular shape having a major axis parallel to the Z axis. The shape of the second surface 4422 is not limited to the rectangular shape and may be other shapes. The length along the Y axis, that is, the thickness of the base 442 may be constant along the Z axis or a part of the length may be different.

The projection 444 is disposed in the center of the major axis of the second surface 4422. The projection 444 is formed in a semispherical shape and projects to the opposite direction of the distal end face 412, that is, the Y-axis plus side. The projection 444 brings the end portion on the Y-axis plus side into contact with the rotor 2 to thereby transmit a driving force of the vibrating section 41 to the rotor 2. The shape of the projection 444 may be a shape other than the semispherical shape. Specifically, the shape of the projection 444 may be a cylindrical shape, a prismatic shape, a conical shape, a pyramid shape, a truncated cone shape, a truncated pyramid shape, or a bullet shape having a center axis parallel to the Y axis, a semi-cylindrical shape having a center axis parallel to the X axis, or the like.

In plan view of the distal end face 412 along the normal of the distal end face 412, the projection 444 is disposed within a range of the recess 414 as shown in FIG. 15. That is, the projection 444 is located on the inner side of an opening section of the recess 414. Therefore, in the base 442, a portion where the projection 444 is located is easily elastically deformed along the Y axis. Consequently, the projection 444 is also easily displaced along the Y axis. As a result, when the projection 444 comes into contact with the rotor 2, the projection 444 is displaced along the Y axis. Therefore, it is possible to allow reaction received from the rotor 2 to escape. In other words, the protrusion section 44 according to this embodiment has mechanical compliance and easily follows the rotor 2. Accordingly, the projection 444 is suppressed from being considerably worn or damaged by the reaction. It is possible to achieve extension of the life of the protrusion section 44.

When the projection 444 is considerably worn, since a contact state of the projection 444 and the rotor 2 considerably changes, the amplitude and a resonance frequency of the vibration of the vibrating section 41 considerably change. Then, a driving characteristic of the rotor 2 by the piezoelectric actuator 3 changes or it is difficult to control the driving of the rotor 2.

On the other hand, in this embodiment, since a wear amount of the projection 444 can be reduced, it is possible to suppress occurrence of the problems described above. Accordingly, it is possible to achieve improvement of the performance and the reliability of the piezoelectric motor 1.

As explained above, the piezoelectric actuator 3 according to this embodiment includes the vibrating section 41 and the protrusion section 44 that transmits the driving force of the vibrating section 41 to the rotor 2, which is the driven section.

The vibrating section 41 includes the piezoelectric elements 6A to 6G, the distal end face 412, and the recess 414 opened on the distal end face 412.

The protrusion section 44 includes the base 442 and the projection 444. In plan view of the distal end face 412, the base 442 overlaps the recess 414 and is fixed to the distal end face 412. The projection 444 is provided in the base 442 and projects in the opposite direction of the distal end face 412.

In the piezoelectric actuator 3 according to this embodiment, in plan view of the distal end face 412, the projection 444 is disposed within the range of the recess 414.

With such a configuration, as explained above, when the projection 444 is brought into contact with the rotor 2, since the projection 444 is displaced along the Y axis, it is possible to allow the reaction received from the rotor 2 by the projection 444 to escape. That is, since the recess 414 is present, room for displacing the projection 444 and a part of the base 442, which supports the projection 444, along the Y axis can be generated. Consequently, the projection 444 is suppressed from being considerably worn or damaged by the reaction. As a result, it is possible to achieve improvement of the durability and extension of the life of the piezoelectric actuator 3.

The piezoelectric motor 1 according to this embodiment includes the piezoelectric actuator 3 and the rotor 2, which is the driven section driven by the piezoelectric actuator 3.

With such a configuration, improvement of the performance and the reliability of the piezoelectric motor 1 are achieved by the improvement of the durability and the extension of the life of the piezoelectric actuator 3.

As explained above, the recess 414 is formed in the groove shape. That is, the recess 414 pierces through the vibrating section 41 along the X axis and is opened on both the sides in the thickness direction of the vibrating section 41. In this embodiment, the thickness direction of the vibrating section 41 means the X-axis direction and is a direction orthogonal to the driving direction (the Z-axis direction) and the urging direction (the Y-axis direction) of the vibrating section 41. Since the recess 414 is formed in such a shape, the recess 414 can be easily manufactured. Accordingly, an individual difference in the shape of the recess 414 less easily occurs and a performance difference involved in the individual difference also less easily occurs. With the groove shape, it is possible to maximize the length along the X axis of the recess 414. Therefore, it is possible to further increase the size of the opening section of the recess 414 and increase the size of the projection 444 disposed within the range of the opening section in plan view. Therefore, it is useful from the viewpoint of improving flexibility of the size of the projection 444 in plan view to form the recess 414 in the groove shape.

The projection 444 includes a contact surface 4441 that is in contact with the rotor 2, which is the driven section. In the projection 444 shown in FIG. 13, the contact surface 4441 is rounded. Since the projection 444 has such a contact surface 4441, the projection 444 is less easily damaged even when a large load is applied to the projection 444. Accordingly, the piezoelectric actuator 3 including such a projection 444 can generate a larger driving force for rotating the rotor 2. The contact surface 4441 being rounded means that the contact surface 4441 is a curved surface including a spherical surface or an aspherical surface.

The contact surface 4441 shown in FIG. 13 includes a spherical surface. When the contact surface 4441 includes the spherical surface, a contact area of the contact surface 4441 and the rotor 2 tends to be fixed. Accordingly, there is an advantage that, even if a contact angle of the contact surface 4441 with the rotor 2 changes, the driving force transmitted to the rotor 2 is easily maintained constant. The spherical surface includes, besides a perfect spherical surface, an elliptical spherical surface and an oval spherical surface.

In the protrusion section 44 shown in FIG. 14, the base 442 and the projection 444 are formed in an integral structure. Accordingly, the mechanical strength of the protrusion section 44 increases. Even when a large driving force is transmitted to the rotor 2, the protrusion section 44 is less easily damaged. Consequently, it is possible to realize the piezoelectric actuator 3 having high reliability. The integral structure means that the base 442 and the projection 444 are made of the same material and no boundary line is present in the cross section of the base 442 and the projection 444.

Examples of the constituent material of the protrusion section 44 include various ceramics such as zirconia, alumina, titania, silicon nitride, and sapphire. In particular, zirconia or alumina is preferably used. Consequently, the protrusion section 44 excellent in durability can be realized.

Portions bonded by the adhesive 45 in the first surface 4421 of the base 442 are formed as fixed sections 4423 as shown in FIGS. 14 and 15. That is, the base 442 includes the fixed sections 4423 fixed to the distal end face 412 of the vibrating section 41. The fixed sections 4423 are respectively provided on both sides of the recess 414 in a direction of a driving force represented by arrows B1 and B2 in FIG. 1, that is, a direction parallel to the Z axis.

With such a configuration, even when the projection 444 is disposed within the range of the recess 414 and mechanical compliance is secured, the protrusion section 44 can be firmly fixed to the vibrating section 41. Consequently, even when the protrusion section 44 receives large reaction from the rotor 2, it is possible to suppress the protrusion section 44 from coming off the vibrating section 41.

As explained above, the piezoelectric actuator 3 according to this embodiment includes the adhesive 45 for bonding the base 442 and the distal end face 412 of the vibrating section 41. The adhesive 45 after hardening preferably has a Young's modulus lower than the Young's modulus of the base 442. With such a configuration, when the projection 444 receives large reaction from the rotor 2, the base 442 not only can be elastically deformed but also can allow the reaction to escape using the low Young's modulus of the adhesive 45. As a result, the projection 444 is suppressed from being considerably worn or damaged by the reaction. It is possible to achieve further extension of the life of the protrusion section 44.

Examples of the adhesive 45 include an epoxy adhesive, a silicone adhesive, an acrylic adhesive, and an urethane adhesive.

The Young's modulus after the hardening of the adhesive 45 is not particularly limited but is preferably approximately 500 to 12500 MPa and more preferably approximately 1000 to 10000 MPa. The Young's modulus of a hardened object of the adhesive 45 is measured at temperature of 25° C. using a method conforming to JIS K 7127: 1999. The adhesive 45 is not limited to an adhesive that hardens after bonding. If an adhesive does not harden after bonding but changes a state from liquid to solid, the Young's modulus of the adhesive after changing to the solid can be measured. The Young's modulus of an adhesive bonding the base 442 and the distal end face 412 of the vibrating section 41 of the piezoelectric actuator 3 completed as a device can be measured.

The fixed sections 4423 may be fixed using a member other than the adhesive 45, for example, an adhesive tape.

Figure 16:
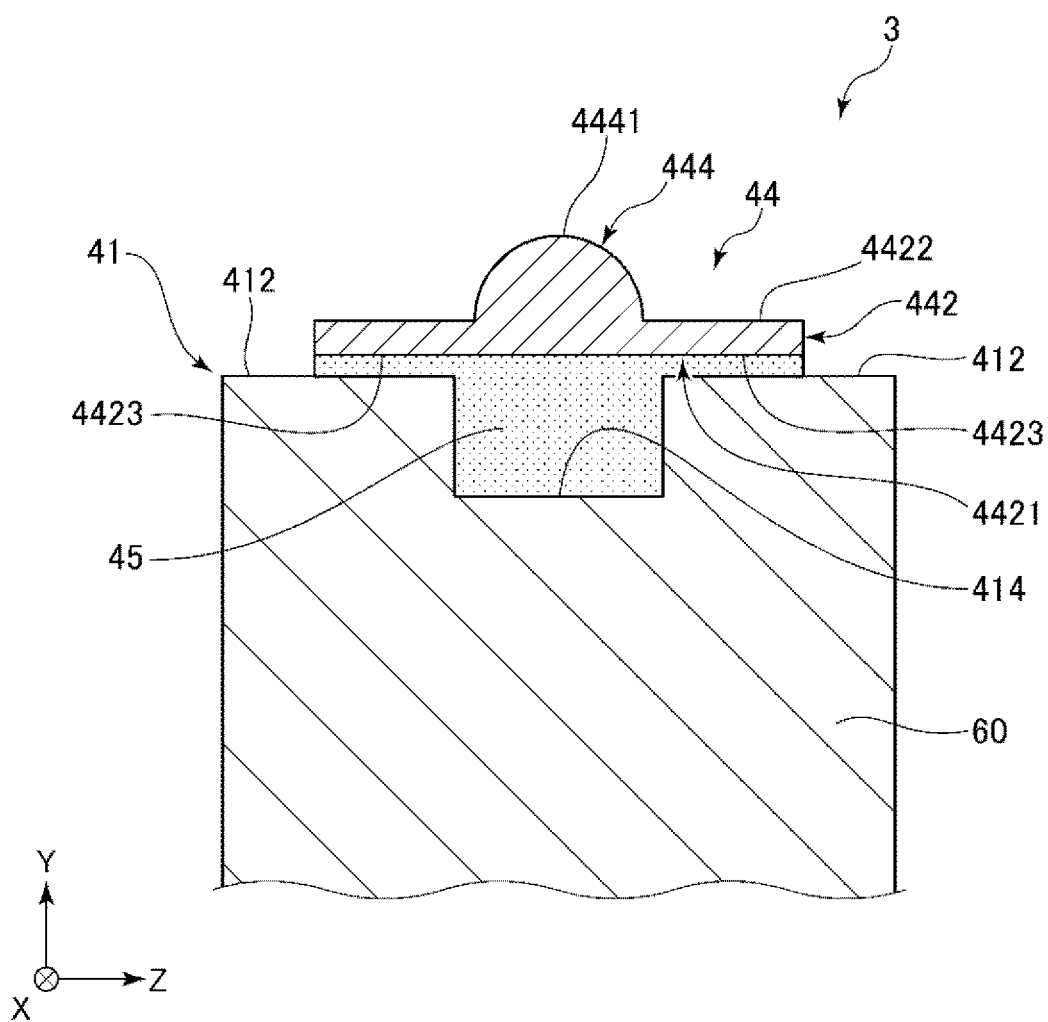
FIG. 16 is a sectional view showing a piezoelectric actuator shown in FIG. 14 in a modification.

FIG. 16 is a sectional view showing a piezoelectric actuator 3 shown in FIG. 14 in a modification.

In the piezoelectric actuator 3 shown in FIG. 16, the adhesive 45 is provided to fill not only a space between the distal end face 412 of the vibrating section 41 and the base 442 but also the recess 414. Consequently, compared with the piezoelectric actuator 3 shown in FIG. 14, a bonding area by the adhesive 45 can be increased. As a result, even when the protrusion section 44 receives large reaction from the rotor 2, it is possible to suppress the protrusion section 44 from coming off the vibrating section 41.

In this case as well, if the Young's modulus of the adhesive 45 after hardening is lower than the Young's modulus of the base 442, even if the recess 414 is filled with the adhesive 45, it is possible to allow reaction received by the projection 444 to escape using the low Young's modulus of the adhesive 45.

On the other hand, the vicinity of the recess 414 of the vibrating section 41 can be reinforced by providing the adhesive 45 in the recess 414. Consequently, it is possible to achieve improvement of the reliability of the vibrating section 41.

The adhesive 45 does not need to fill the entire recess 414 and may be filled, for example, only in the vicinity of the distal end face 412 in the recess 414. As an example of such a case, an amount of the adhesive 45 shown in FIG. 14 is large and a part of the adhesive 45 flows out to the recess 414 side.

Length Z1 along the Z axis of the opening section of the recess 414 shown in FIG. 14 is set as appropriate according to, for example, the size of the vibrating section 41. The length Z1 is preferably 0.2 mm or more and 2.0 mm or less and more preferably 0.5 mm or more and 1.5 mm or less.

Length Z2 along the Z axis of the projection 444 is set as appropriate according to, for example, the sizes of the vibrating section 41 and the recess 414. The length Z2 is preferably 0.1 mm or more and 2.0 mm or less and more preferably 0.3 mm or more and 1.0 mm or less.

A difference between the length Z1 and the length Z2 is not particularly limited. However, the difference is preferably 1.0 mm or less and more preferably 0.01 mm or more and 0.50 mm or less. Since the difference between the length Z1 and the length Z2 affects the mechanical compliance described above, the wear or the damage of the projection 444 is further suppressed by setting the difference within this range.

Length Z3 along the Z axis of the base 442 is set as appropriate according to, for example, the size of the vibrating section 41. The length Z3 is preferably 0.5 mm or more and 5.0 mm or less and more preferably 1.0 mm or more and 3.0 mm or less.

The length Z1 is preferably 30% or more and 90% or less of the length Z3 and more preferably 50% or more and 80% or less of the length Z3. By setting a ratio of the length Z1 to the length Z3 within this range, it is possible to secure necessary and sufficient length of the fixed sections 4423. Consequently, even when the protrusion section 44 receives large reaction from the rotor 2, it is possible to suppress the protrusion section 44 from coming off the vibrating section 41.

Based on the above, the lengths Z1, Z2, and Z3 preferably satisfy at least Z3>Z1≥Z2. Consequently, even if the projection 444 receives a large reaction from the rotor 2, it is possible to efficiently allow the reaction to escape while surely fixing the protrusion section 44 to the vibrating section 41.

A value obtained by subtracting length X2 along the X axis of the projection 444 from length X1 along the X axis of the opening section of the recess 414 is not particularly limited. However, the value is preferably −0.5 mm or more and 1.0 mm or less and more preferably −0.2 mm or more and 0.50 mm or less. Since the value of X1−X2 affects the mechanical compliance, the wear or the damage of the projection 444 is further suppressed by setting the value within this range.

Length X3 along the X axis of the base 442 is preferably 100% or more and 200% or less of the length X2 and more preferably 105% or more and 150% or less of the length X2.

Length Y1 along the Y axis of the recess 414, that is, the depth of the recess 414 shown in FIG. 14 is not particularly limited. However, the length Y1 is preferably 0.05 mm or more and 1.0 mm or less and more preferably 0.10 mm or more and 0.50 mm or less. By setting the depth of the recess 414 within this range, it is possible to secure room sufficient for the projection 444 to be displaced while suppressing a harmful effect due to excessive depth of the recess 414, for example, suppressing the recess 414 from affecting a driving force generated from the vibrating section 41.

Length Y2 along the Y axis of the base 442, that is, the thickness of the base 442 is not particularly limited. However, the length Y2 is preferably 0.03 mm or more and 0.70 mm or less and more preferably 0.05 mm or more and 0.50 mm or less. When the thickness of the base 442 is set within this range, the base 442 has mechanical compliance for enabling the base 442 to be elastically deformed while securing rigidity enough for preventing the base 442 to be broken.

Length Y3 along the Y axis of the projection 444, that is, the projecting height of the projection 444 is not particularly limited. However, the length Y3 is preferably 10% or more and 70% or less of the length Z2 and more preferably 30% or more and 60% or less of the length Z2.

The configuration of the protrusion section 44 can be optimized according to not only the dimensions described above but also a "spring constant" calculated from a shape, a constituent material, and the like. The spring constant is the inverse of the mechanical compliance described above and is a constant of proportionality obtained by dividing an applied load by extension.

When the spring constant of the projection 444 is represented as Ka and the spring constant of the base 442 is represented as Kb, a combined spring constant Kt of the entire protrusion section 44 is represented by $Kt=1/\{(1/Ka)+(1/Kb)\}$. When an operating time of the piezoelectric actuator 3 increases, a probability of the wear or the damage of the projection 444 increases. Even if the shape of the projection 444 changes and the spring constant Ka changes in this way, if a change in the combined spring constant Kt is small, it is possible to suppress changes in the amplitude and the resonance frequency of the vibration of the vibrating section 41. Consequently, the reliability of the piezoelectric actuator 3 is improved.

Considering the influence of the spring constant Ka on the combined spring constant Kt, Kb≤0.5Ka is preferable and Kb≤0.1Ka is more preferable. Consequently, even if the spring constant Ka changes because of wear or the like, it is possible to suppress a change in the combined spring constant Kt.

The following Table 1 shows a rate of change of the combined spring constant Kt calculated when, in an example in which the spring constant Kb of the base 442 is ten times as large as the spring constant Ka of the projection 444 before wear or the like, Ka changes to a double and a triple.

TABLE 1

| Ka | 10 | 20 | 30 |
|---|---|---|---|
| Kb | 100 | 100 | 100 |
| Kt | 9.1 | 16.7 | 23.1 |
| Rate of change of Kt | — | 83% | 154% |

As shown in Table 1, when the spring constant Kb of the base 442 is larger than the spring constant Ka of the projection 444, it is recognized that the influence of a change in Ka on Kt is large.

On the other hand, the following Table 2 shows a rate of change of the combined spring constant Kt calculated when, in an example in which the spring constant Kb of the base 442 is equal to the spring constant Ka of the projection 444 before wear or the like, Ka changes to a double and a triple.

TABLE 2

| Ka | 10 | 20 | 30 |
|---|---|---|---|
| Kb | 10 | 10 | 10 |
| Kt | 5.0 | 6.7 | 7.5 |
| Rate of change of Kt | — | 33% | 50% |

As shown in Table 2, when the spring constant Kb of the base 442 is equal to the spring constant Ka of the projection 444, although the rate of change of Kt is suppress more than Kt in Table 1, the rate of change is still large.

The following Table 3 shows a rate of change of the combined spring constant Kt calculated when, in an example in which the spring constant Kb of the base 442 is 0.1 times as large as the spring constant Ka of the projection 444 before wear or the like, Ka changes to a double and a triple.

TABLE 3

| Ka | 10 | 20 | 30 |
|---|---|---|---|
| Kb | 1 | 1 | 1 |
| Kt | 0.9 | 1.0 | 1.0 |
| Rate of change of Kt | — | 5% | 6% |

As shown in Table 3, when the spring constant Kb of the base 442 is set smaller than the spring constant Ka of the projection 444, it is recognized that the rate of change of Kt is sufficiently suppressed.

Based on the calculation examples described above, it is recognized that it is useful to examine the configurations of the base 442 and the projection 444 considering the spring constants. In a second embodiment explained below, as an example of the configurations, constituent materials are differentiated in the base 442 and the projection 444.

2. Second Embodiment

A piezoelectric motor according to a second embodiment is explained.

Figure 17:
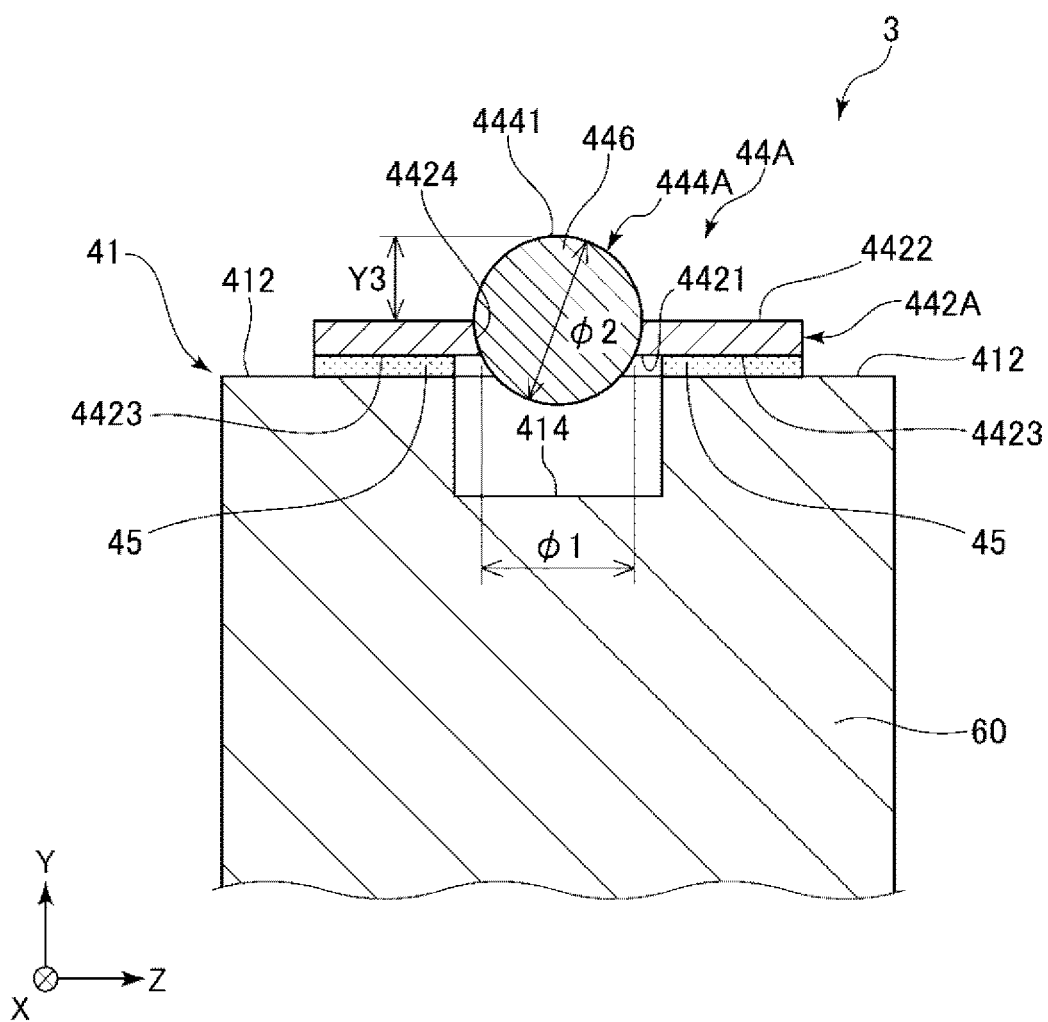
FIG. 17 is a sectional view showing a vibrating section included in a piezoelectric motor according to a second embodiment and a protrusion section attached to the vibrating section.

FIG. 17 is a sectional view showing the vibrating section 41 included in the piezoelectric motor according to the second embodiment and a protrusion section 44A attached to the vibrating section 41.

The second embodiment is explained below. In the following explanation, differences from the first embodiment are mainly explained. Explanation of similarities to the first embodiment is omitted. In FIG. 17, the same components as the components in the first embodiment are denoted by the same reference numerals and signs.

The second embodiment is the same as the first embodiment except that the configuration of the protrusion section 44A is different.

As shown in FIG. 17, the protrusion section 44A includes a base 442A and a sphere 446.

The base 442A is formed in the same tabular shape as the tabular shape of the base 442 in the first embodiment. The two fixed sections 4423 included in the base 442A and the distal end face 412 of the vibrating section 41 are bonded via the adhesive 45. The base 442A includes a through-hole 4424 that pierces through the base 442A from the first surface 4421 to the second surface 4422. The inner surface of the through-hole 4424 is a curved surface conforming to the surface shape of the sphere 446.

The sphere 446 is inserted into the through-hole 4424. The surface of the sphere 446 and the inner surface of the through-hole 4424 are in contact. Consequently, the sphere 446 and the through-hole 4424 fit with each other. A minimum inner diameter ϕ1 of the through-hole 4424 is smaller than a diameter ϕ2 of the sphere 446. Consequently, the sphere 446 is fixed in a state in which the sphere 446 is inserted into the through-hole 4424. In the sphere 446, a portion projecting from the second surface 4422 of the base 442A is formed as a projection 444A having a spherical surface. The projection 444A has the same function as the function of the projection 444 according to the first embodiment.

The sphere 446 may be fit and fixed in the through-hole 4424 or may be fixed via an interposed object such as an adhesive. The projection 444A can take a shape other than the spherical surface like the projection 444 according to the first embodiment.

A projecting height Y3 of the projection 444A can be adjusted by adjusting the minimum inner diameter ϕ1 of the through-hole 4424. The projecting height Y3 of the projection 444A is preferably 10% or more and 70% or less of the diameter ϕ2 of the sphere 446 and more preferably 30% or more and 60% or less of the diameter ϕ2. Consequently, it is possible to achieve both of sure fixing of the sphere 446 and securing of a sufficient projecting height Y3. As a result, it is possible to realize the protrusion section 44A, a change in characteristics of which is small even if the protrusion section 44A is worn, while securing reliability.

Although not shown in FIG. 17, the through-hole 4424 may be a recess for fitting that does not pierce through the base 442A and is opened on the second surface 4422. In that case, as in the through-hole 4424, the sphere 446 is inserted into the recess for fitting and the sphere 446 and the recess for fitting fit with each other, whereby the sphere 446 is fixed to the base 442A. In this case as well, the sphere 446 may be fixed to the base 442A via an interposed object such as an adhesive rather than being fixed by the fitting.

As explained above, in this embodiment, the base 442A and the projection 444A are separate structures. With such a configuration, the constituent material of the base 442A and the constituent material of the projection 444A can be differentiated. Accordingly, for example, a material having high hardness and excellent in wear resistance can be used as the constituent material of the projection 444A and a material having high toughness and excellent in elastic deformability can be used as the constituent material of the base 442A. That is, materials respectively suitable for the projection 444A and the base 442A can be selected. As a result, it is possible to suppress marked wear or damage of the projection 444A due to a reaction. It is possible to achieve further extension of the life of the protrusion section 44A. It is also possible to achieve improvement of the performance and the reliability of the piezoelectric motor 1.

In this embodiment, the base 442A includes the first surface 4421 on the distal end face 412 side of the vibrating section 41, the second surface 4422 opposite to the first surface 4421, and the through-hole 4424 or the recess for fitting piercing through the base 442A from the first surface 4421 to the second surface 4422. The projection 444A is inserted into the through-hole 4424 or the recess for fitting.

With such a configuration, even when the projection 444A and the base 442A are formed as the separated structures, the projection 444A can be surely fixed to the base 442A. Accordingly, even when the projection 444 receives large reaction from the rotor 2, the projection 444A is suppressed from shifting or coming off.

Examples of the constituent material of the base 442A include metal materials such as stainless steel and phosphor bronze and ceramics materials such as alumina and zirconia. In particular, the metal materials are preferably used. Since the metal materials have high toughness and are excellent in elastic deformability, the metal materials can facilitate deformation of the protrusion section 44A and efficiently allow reaction received by the protrusion 44A to escape. From the viewpoint of a spring constant, since a spring constant of the metal materials is easily reduced compared with the ceramics material, the metal materials are useful as the constituent material of the base 442A.

In this embodiment, the sphere 446 pierces through the through-hole 4424. The sphere 446 is inserted into the recess 414. In this case, the depth of the recess 414, the size of the opening section of the recess 414, and the like only have to be set as appropriate such that the sphere 446 and the inner surface of the recess 414 do not come into contact with each other.

In the second embodiment explained above, the same effects as the effects in the first embodiment can be obtained.

3. Third Embodiment

A piezoelectric motor according to a third embodiment is explained.

Figure 18:
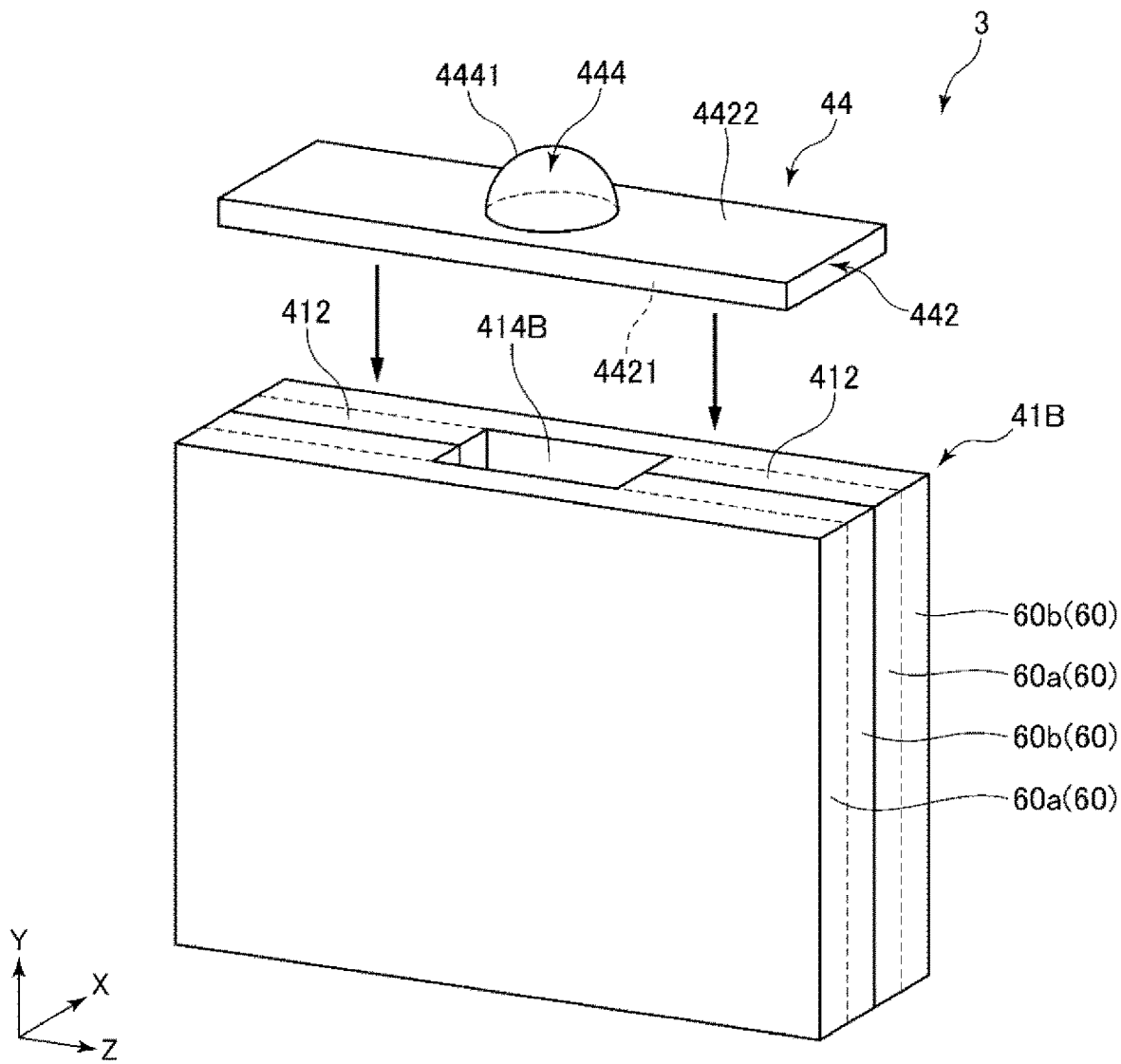
FIG. 18 is an exploded partially enlarged perspective view showing a vibrating section included in a piezoelectric motor according to a third embodiment and a protrusion section attached to the vibrating section.
Figure 19:
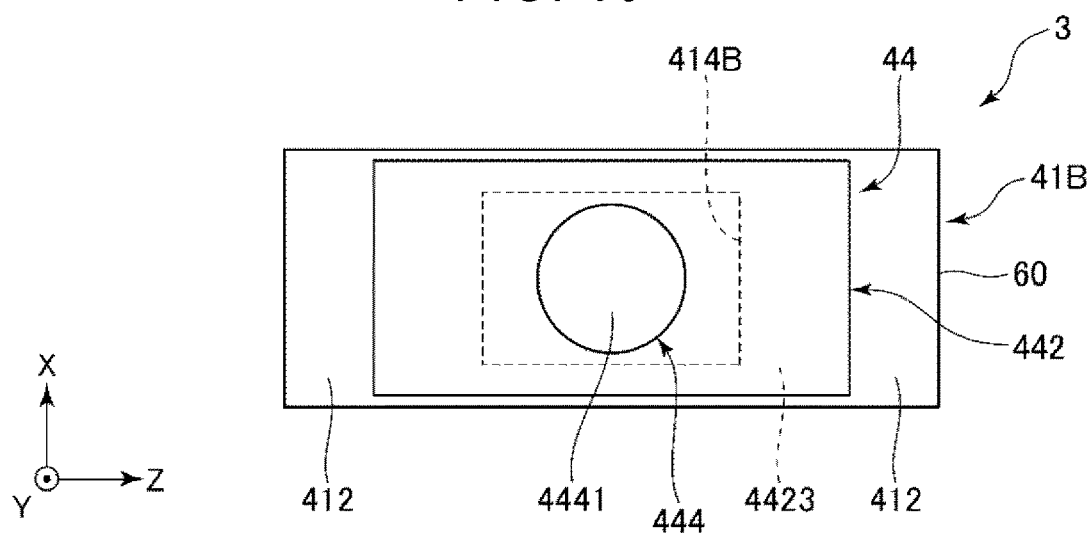
FIG. 19 is a plan view of the protrusion section and the vibrating section shown in FIG. 18 viewed from the Y-axis plus side.

FIG. 18 is an exploded partially enlarge perspective view showing a vibrating section 41B included in the piezoelectric motor according to the third embodiment and the protrusion section 44 attached to the vibrating section 41B. FIG. 19 is a plan view of the protrusion section 44 and the vibrating section 41B shown in FIG. 18 viewed from the Y-axis plus side. In FIG. 19, the protrusion section 44 is seen through and shown.

The third embodiment is explained below. In the following explanation, differences from the first and second embodiments are mainly explained. Explanation of similarities to the first and second embodiments is omitted. In FIGS. 18 and 19, the same components as the components in the first and second embodiments are denoted by the same reference numerals and signs.

The third embodiment is the same as the first embodiment except that the configuration of the vibrating section 41B is different.

In the first embodiment, the recess 414 pierces through the four piezoelectric element units 60 along the X axis. On the other hand, a recess 414B of the vibrating section 41B shown in FIG. 18 is provided in two piezoelectric element units 60 on the inner side and is not provided in two piezoelectric element units 60 on the outer side among the stacked four piezoelectric element units 60.

Accordingly, the recess 414B is not opened on the X-axis plus side and the X-axis minus side. An opening section of the recess 414B is surrounded by the distal end face 412. Accordingly, the fixed section 4423, which is a part of the base 442, is formed in an annular shape to surround the recess 414B as shown in FIG. 19. Consequently, the protrusion section 44 can be more firmly fixed to the vibrating section 41. In particular, even when a force is applied to the projection 444 along the X axis, the protrusion section 44 less easily comes off the vibrating section 41B.

In plan view of the distal end face 412, the shape of the opening section of the recess 414B shown in FIG. 19 is formed in a rectangular shape. However, the shape is not particularly limited.

Figure 20:
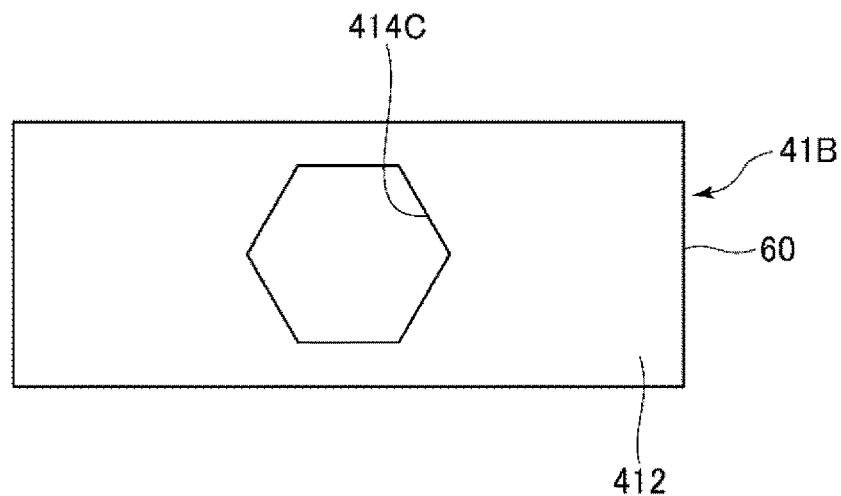
FIG. 20 is a diagram showing a shape of an opening section of a recess in a modification and is a diagram showing only a vibrating section including the recess in the modification.
Figure 21:
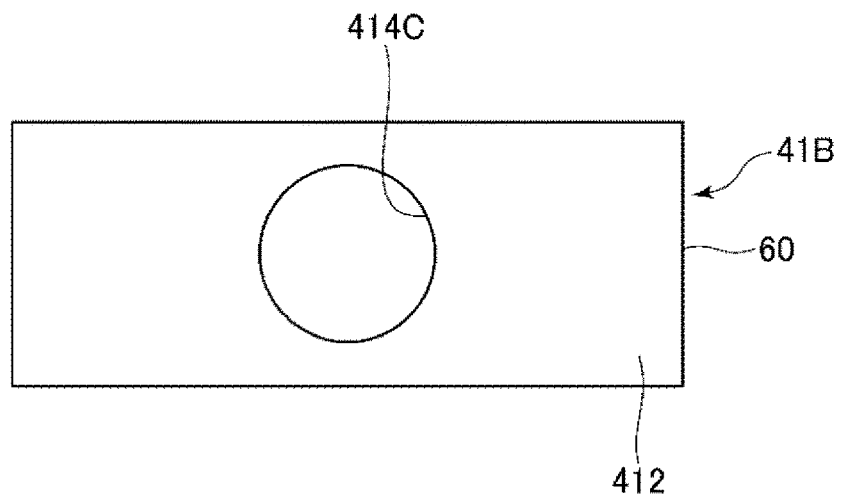
FIG. 21 is a diagram showing a shape of the opening section of the recess in a modification and is a diagram showing only the vibrating section including the recess in the modification.
Figure 22:
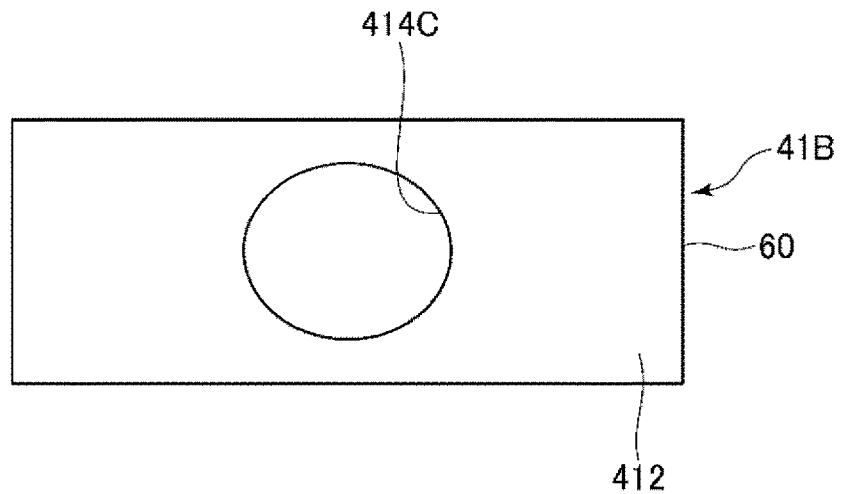
FIG. 22 is a diagram showing a shape of the opening section of the recess in a modification and is a diagram showing only the vibrating section including the recess in the modification.

FIGS. 20 to 22 are diagrams showing only the shape of the opening section of the recess 414B in a modification and the vibrating section 41B including a recess 414C in the modification.

An opening section of the recess 414C shown in FIG. 20 is formed in a hexagonal shape. In the recess 414C including such an opening section, a contour of the opening section is formed by combining straight lines. Since an interior angle of the opening section is an obtuse angle, stress relatively less easily concentrates. Accordingly, it is possible to achieve both of manufacturing easiness and crack resistance. The opening section may be formed in, besides the hexagonal shape, for example, other polygonal shapes such as an octagonal shape and a decagonal shape.

The opening section of the recess 414C shown in FIG. 21 is formed in a circular shape. In the recess 414C including such an opening section, a contour of the opening section is formed by only a curved line. Therefore, it is particularly easy to reduce stress concentration. Accordingly, the recess 414C is particularly excellent in crack resistance.

The opening section of the recess 414C shown in FIG. 22 is formed in an elliptical shape. In the recess 414C including such an opening section, a contour of the opening section is formed by only a curved line and a larger area can be secured compared with when the opening section is circular. Accordingly, the recess 414C is excellent in crack resistance and a range in which the base 442 is displaced can be further expanded. As a result, it is easier to allow reaction received by the projection 444 to escape.

As explained above, in the piezoelectric actuator 3 according to this embodiment, in plan view of the distal end face 412, the opening section of the recess 414C is formed in the polygonal shape, the circular shape, or the elliptical shape. With such a configuration, it is possible to add various functions corresponding to the shapes of the opening section, for example, a function of increasing mechanical strength of the vicinity of the recess 414C based on improvement of crack resistance.

The shape of the opening section of the recess 414C is not limited to closed shapes shown in the figures and may be a shape, at least a part of which is opened.

4. Fourth Embodiment

Figure 23:
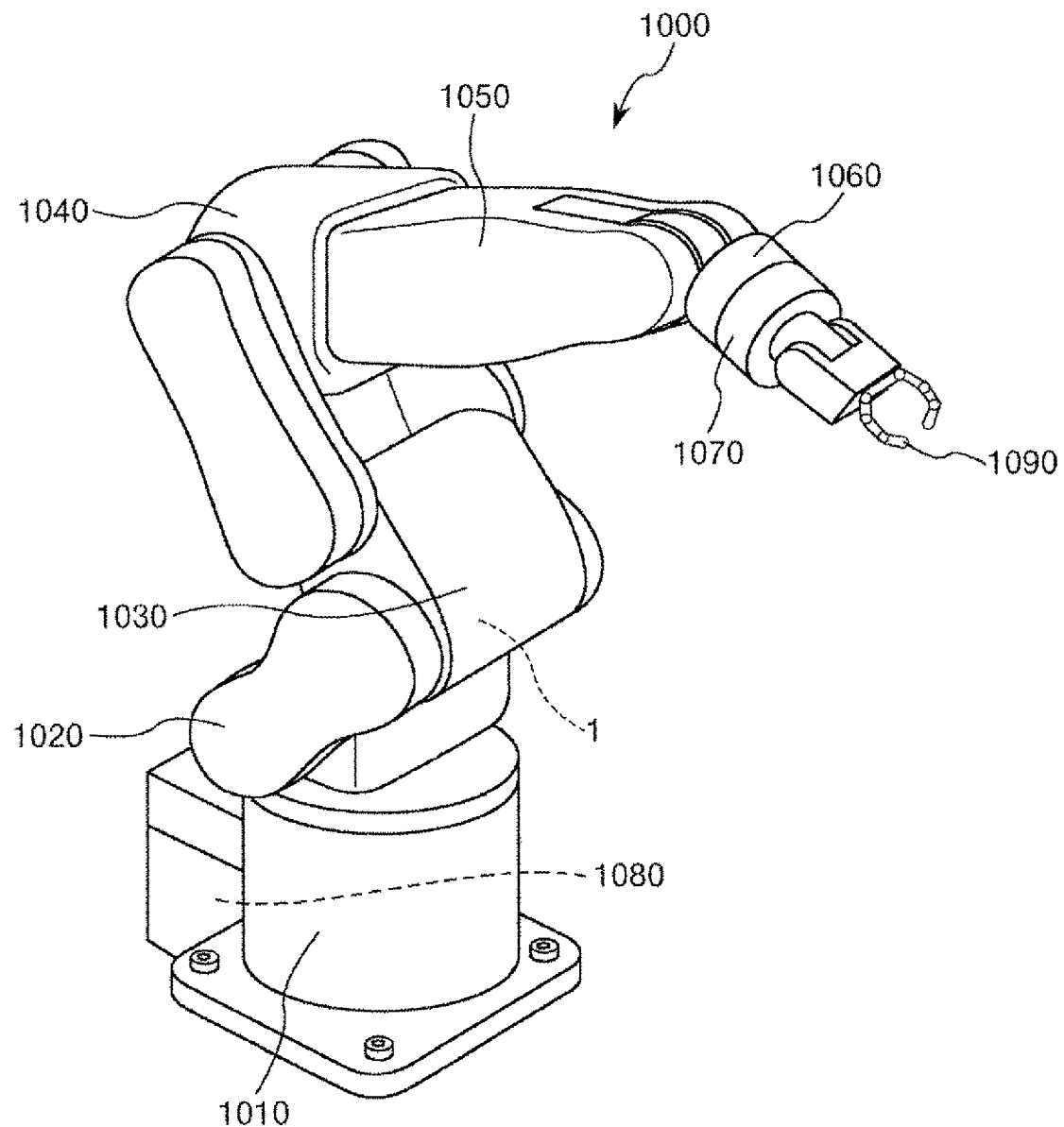
FIG. 23 is a perspective view showing a robot according to a fourth embodiment.

FIG. 23 is a perspective view showing a robot according to a fourth embodiment.

A robot 1000 shown in FIG. 23 is a robot that performs work such as supply, removal, conveyance, and assembly of a precision instrument and components configuring the precision instrument. The robot 1000 is a six-axis robot and includes a base 1010 fixed to a floor or a ceiling, an arm 1020 turnably coupled to the base 1010 via a joint section, an arm 1030 turnably coupled to the arm 1020 via a joint section, an arm 1040 turnably coupled to the arm 1030 via a joint section, an arm 1050 turnably coupled to the arm 1040 via a joint section, an arm 1060 turnably coupled to the arm 1050 via a joint section, an arm 1070 turnably coupled to the arm 1060 via a joint section, and a control device 1080 that controls driving of a robot arm including the arms 1020, 1030, 1040, 1050, 1060, and 1070.

A hand coupling section is provided in the arm 1070. An end effector 1090 corresponding to work to be executed by the robot 1000 is attached to the hand coupling section. The piezoelectric motor 1 is mounted on a part or all of the joint sections. Each of the arms 1020, 1030, 1040, 1050, 1060, and 1070 turns according to driving of the piezoelectric motor 1. The piezoelectric motor 1 may be mounted on the end effector 1090 and used for driving of the end effector 1090.

The control device 1080 includes, for example, a processor such as a CPU, a memory, and an interface. The processor executes a predetermined program stored in the memory to control driving of the sections of the robot 1000. The program may be downloaded from an external server via the interface. All or a part of the components of the control device 1080 may be provided on the outside of the robot 1000 and coupled via a communication network such as a LAN (local area network).

As explained above, such a robot 1000 includes the piezoelectric motor 1 and the robot arm or the end effector 1090. The piezoelectric motor 1 drives the robot arm or the end effector 1090.

That is, the robot 1000 according to this embodiment includes the piezoelectric motor 1 and the robot arm driven by the piezoelectric motor 1.

With such a configuration, as explained above, improvement of the performance and the reliability of the piezoelectric motor 1 are achieved by the improvement of the durability and the extension of the life of the piezoelectric actuator 3. Therefore, it is also possible to achieve improvement of the performance and the reliability of the robot 1000. In particular, it is possible to realize the robot 1000 that maintains high performance and high reliability even if the robot arm is driven at high torque.

The piezoelectric actuator, the piezoelectric motor, and the robot of the present disclosure are explained above based on the embodiments shown in the figures. However, the present disclosure is not limited to this. The configuration of the sections in the embodiments can be replaced with any components having the same functions. Any components may be added to the embodiments. Further, the embodiments may be combined as appropriate.

The piezoelectric motor of the present disclosure can be used in, for example, a calendar feeding mechanism for a wristwatch, a slow motion stage, and the like besides the robot explained above.

What is claimed is:

1. A piezoelectric actuator comprising:
    a vibrating section including a piezoelectric element, a distal end face, and a recess opened on the distal end face; and
    a protrusion section including a base that overlaps the recess in plan view of the distal end face and is fixed to the distal end face and a projection that is provided in the base and projects in an opposite direction of the distal end face, the protrusion section transmitting a driving force of the vibrating section to a driven section, wherein
    in plan view of the distal end face, the projection is disposed within a range of the recess.

2. The piezoelectric actuator according to claim 1, wherein the recess is opened on both sides in a thickness direction of the vibrating section.

3. The piezoelectric actuator according to claim 1, wherein, in plan view of the distal end face, an opening section of the recess is formed in a polygonal shape, a circular shape, or an elliptical shape.

4. The piezoelectric actuator according to claim 1, wherein
    the base includes a fixed section fixed to the distal end face, and
    the fixed section is provided on both sides of the recess in a direction of the driving force.

5. The piezoelectric actuator according to claim 1, further comprising an adhesive for bonding the base and the distal end face, wherein
    a Young's modulus of the adhesive after hardening is lower than a Young's modulus of the base.

6. The piezoelectric actuator according to claim 1, wherein
    the projection includes a contact surface that is in contact with the driven section, and
    the contact surface is rounded.

7. The piezoelectric actuator according to claim 6, wherein the contact surface includes a spherical surface.

8. The piezoelectric actuator according to claim 1, wherein the base and the projection are formed in an integral structure.

9. The piezoelectric actuator according to claim 1, wherein the base and the projection are formed in separated structures.

10. The piezoelectric actuator according to claim 9, wherein
    the base includes a first surface on the distal end face side, a second surface opposite to the first surface, and a through-hole piercing through the base from the first surface to the second surface or a recess for fitting opened on the second surface, and
    the projection is inserted into the through-hole or the recess for fitting.

11. A piezoelectric motor comprising:
    the piezoelectric actuator according to claim 1; and
    the driven section driven by the piezoelectric actuator.

12. A robot comprising:
    the piezoelectric motor according to claim 11; and
    a robot arm driven by the piezoelectric motor.

* * * * *